(12) United States Patent
Hawthorne et al.

(10) Patent No.: US 11,294,800 B2
(45) Date of Patent: Apr. 5, 2022

(54) DETERMINING PERFORMANCE OF AUTONOMY DECISION-MAKING ENGINES

(71) Applicant: The Johns Hopkins University, Baltimore, MD (US)

(72) Inventors: Robert C. Hawthorne, Columbia, MD (US); Galen E. Mullins, Silver Spring, MD (US); Paul G. Stankiewicz, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 853 days.

(21) Appl. No.: 16/152,520

(22) Filed: Oct. 5, 2018

(65) Prior Publication Data
US 2019/0179738 A1 Jun. 13, 2019

Related U.S. Application Data

(60) Provisional application No. 62/595,640, filed on Dec. 7, 2017.

(51) Int. Cl.
*G06F 11/36* (2006.01)
*G01C 21/34* (2006.01)
(Continued)

(52) U.S. Cl.
CPC ........ *G06F 11/3688* (2013.01); *G01C 21/343* (2013.01); *G06F 11/3457* (2013.01);
(Continued)

(58) Field of Classification Search
CPC ............. G06F 11/3688; G06F 11/3457; G06F 11/3664; G06F 11/3684; G06F 11/3696; G06F 30/20; G01C 21/343
See application file for complete search history.

(56) References Cited

U.S. PATENT DOCUMENTS

2011/0231173 A1* 9/2011 Ikeda ...................... G06F 30/30
703/13
2014/0008442 A1* 1/2014 Yamaguchi .......... G06K 7/1452
235/470
(Continued)

OTHER PUBLICATIONS

Brun et al. "A new split and merge algorithm based on Discrete Map" Journal of WSCG. 1997, vol. 5, No. 1-3, p. 21-30 [retrieved on Nov. 22, 2021] (Year: 1997).*
(Continued)

*Primary Examiner* — Rehana Perveen
*Assistant Examiner* — Alfred H B Wechselberger
(74) *Attorney, Agent, or Firm* — Sung T. Kim

(57) ABSTRACT

An example method for simulation testing an autonomy software is provided. The example method may include receiving, at processing circuitry, mission parameters indicative of a test mission, environmental parameters, and vehicle parameters. The method may further include performing, by the processing circuitry, an adaptive search using a surrogate model of the autonomy software under test to selectively generate test scenarios for simulation, and clustering the plurality of test scenarios based on performance score metric values to determine performance boundaries for the autonomy software under test. The method may further include ranking the plurality of test scenarios based on a respective distance to a performance boundary to identify test scenarios of interest for modification of the autonomy software or real-world field testing of an autonomous vehicle.

20 Claims, 10 Drawing Sheets

(51) Int. Cl.
  *G06F 11/34* (2006.01)
  *G06F 30/20* (2020.01)
(52) U.S. Cl.
  CPC ...... *G06F 11/3664* (2013.01); *G06F 11/3684* (2013.01); *G06F 11/3696* (2013.01); *G06F 30/20* (2020.01)

(56) References Cited

U.S. PATENT DOCUMENTS

2017/0243404 A1* 8/2017 Morales ............... G06T 5/40
2019/0236479 A1   8/2019 Wagner et al.

OTHER PUBLICATIONS

Sugiarto, I. "Algorithms and Hardware for Reasoning in Factor Graphs" (Thesis) Lehrstuhl fur Steuerungs- und Regelungstechnik Technische Universitat Munchen [retrieved on Nov. 22, 2021] (Year: 2015).*

Dusmez et al. "Remaining Useful Lifetime Estimation for Power MOSFETs Under Thermal Stress with RANSAC Outlier Removal" IEEE Trans on Industrial Informatics [retrieved on Nov. 22, 2021] (Year: 2017).*

Schultz et al. "Adaptive Testing of Controllers for Autonomous Vehicles" Adaptive testing of controllers for autonomous vehicles, Proceedings of the 1992 Symposium on Autonomous Underwater Vehicle Technology, 1992, pp. 158-164, doi: 10.1109/AUV.1992.225178 [retrieved on Nov. 16, 2021] (Year: 1992).*

Terrile et al. "Evolutionary Computation for the Identification of Emergent Behavior in Autonomous Systems" Evolutionary Computation for the identification of emergent behavior in autonomous systems, 2009 IEEE Aerospace conference, pp. 1-6, doi: 10.1109/AERO.2009.4839731 [retrieved on Nov. 16, 2021] (Year: 2009).*

Visnevski et al. "Evolutionary Computing for Mission-Based Test and Evaluation of Unmanned Autonomous Systems" Evolutionary computing for mission-based test and evaluation of unmanned autonomous systems, 2010 IEEE Aerospace Conference, pp. 1-10, doi: 10.1109/AERO.2010.54 [retrieved on Nov. 16, 2021] (Year: 2010).*

* cited by examiner

DETERMINING PERFORMANCE OF AUTONOMY DECISION-MAKING ENGINES

CROSS-REFERENCE TO RELATED APPLICATIONS

This application claims the benefit of U.S. Provisional Application No. 62/595,640 filed on Dec. 7, 2017, the entire contents of which are incorporated herein by reference.

STATEMENT REGARDING FEDERALLY SPONSORED RESEARCH OR DEVELOPMENT

This invention was made with Government support under contract number W9000KK-14-C-0004 awarded by the U.S. Department of the Army. The Government has certain rights in the invention.

TECHNICAL FIELD

Example embodiments generally relate to system performance testing and, in particular, relate to determining performance of autonomy decision-making engines.

BACKGROUND

As autonomous vehicles become more complex, understanding how such vehicles will behave in complicated and uncertain environments poses a greater challenge to both the engineers who write the underlying code and the testers that validate autonomy decision-making engines. The systems and underlying software that make decisions to control an autonomous vehicle comprise many different integrated software modules. Designers of these systems may have expertise in individual modules, but the complex interplay that results in the final emergent behavior of the system cannot be easily characterized or predicted. For example, an unmanned underwater vehicle (UUV) tasked with a covert survey mission may have multiple subsystems and behavioral modes that must work in concert in the presence of competing priorities, such as, for example, offsetting the risk of detection when surfacing with the need to localize via GPS. Competing priorities are of particular concern for long duration missions where the vehicle must transition among multiple mission objectives. These systems can exhibit a variety of possible outcomes, some of which would be considered failing outcomes. For example, colliding with an obstacle, returning home early, or completing the mission successfully are types of outcomes that such a system could exhibit. It can be difficult to provide guarantees of the system's decision-making capabilities without considering all possible scenarios and thus discovering all of the possible outcomes.

An issue that is encountered when performing simulations to test these systems and describe their performance is that the number of parameters in the testing space quickly increases when attempting to simulate realistic missions. Moving and static obstacles, environmental factors, time constraints, and mission types are just a few of the different parameters upon which an engineer may wish to test in order to obtain a complete understanding of the performance of an autonomous system. As missions and environments become more complicated, the number of parameters that constitute the testing space may become very large. As a result, conventional techniques used to test autonomy software may be incapable of effectively performing such testing. The familiar curse of dimensionality can prevent conventional techniques from being able to effectively determine system performance because all permutations of a mission must be simulated. Simulated mission duration using conventional approaches may take several hours or even days to complete. Due to the number of dynamic parameters, attempting to test every possible scenario would be so time consuming, even with substantial processing power, that such an approach may be considered ineffective for the purpose.

BRIEF SUMMARY OF SOME EXAMPLES

According to some example embodiments, a method for simulation testing an autonomy software is provided. The method may comprise receiving, at processing circuitry, mission parameters indicative of a test mission, and receiving, at the processing circuitry, environmental parameters and vehicle parameters. The method may further comprise performing, by the processing circuitry, an adaptive search using a surrogate model of the autonomy software under test to selectively generate test scenarios for simulation. In this regard, performing the adaptive search may comprise generating the surrogate model based on performance score metric values that are outputs from previously simulated test scenarios, and iteratively generating a plurality of test scenarios based on the surrogate model of the autonomy software under test. Each test scenario may have a defined set of mission parameters, environmental parameters, and vehicle parameters. Performing the adaptive search may also comprise simulating the plurality of test scenarios on the autonomy software under test to generate performance score metric values for each test scenario. Additionally, the method may comprise clustering, by the processing circuitry, the plurality of test scenarios based on the performance score metric values to determine the performance boundaries for the autonomy software under test. The performance boundaries may be defined as boundaries between performance modes where less than a threshold change in one of the mission parameters, the environmental parameters, and vehicle parameters results in a test scenario having performance score metric values corresponding to a different performance mode. Each performance mode may be associated with an outcome category for the test scenarios. The method may further comprise ranking, by the processing circuitry, the plurality of test scenarios based on a respective distance to a performance boundary to identify test scenarios of interest for modification of the autonomy software or real-world field testing of an autonomous vehicle.

According to some example embodiments, an apparatus configured to perform simulation testing of an autonomy software is also provided. The apparatus may comprise processing circuitry configured to receive mission parameters indicative of a test mission, receive environmental parameters and vehicle parameters, and perform an adaptive search using a surrogate model of the autonomy software under test to selectively generate test scenarios for simulation. To perform the adaptive search, the processing circuitry may be configured to generate the surrogate model based on performance score metric values that are outputs from previously simulated test scenarios, and iteratively generate a plurality of test scenarios based on the surrogate model of the autonomy software under test. Each test scenario may have a defined set of mission parameters, environmental parameters, and vehicle parameters. To perform the adaptive search, the processing circuitry may be further configured to simulate the plurality of test scenarios on the autonomy software under test to generate performance score metric values for each test scenario. According to some example embodiments, the processing circuitry may be further configured to cluster the plurality of test scenarios based on the performance score metric values to determine the performance boundaries for the autonomy software under test. In this regard, the performance boundaries may be defined as boundaries between performance modes where less than a threshold change in one of the mission parameters, the environmental parameters, and vehicle parameters results in a test scenario having performance score metric values corresponding to a different performance mode. Each performance mode may be associated with an outcome category for the test scenarios. The processing circuitry may be further configured to rank the plurality of test scenarios based on a respective distance to a performance boundary to identify test scenarios of interest for modification of the autonomy software or real-world field testing.

According to some example embodiments, a system is also provided. The system may comprise a real-world test implementation system and an apparatus configured to perform simulation testing of an autonomy software. The apparatus may comprise processing circuitry configured to receive mission parameters indicative of a test mission, receive environmental parameters and vehicle parameters, and perform an adaptive search using a surrogate model of the autonomy software under test to selectively generate test scenarios for simulation. To perform the adaptive search, the processing circuitry may be configured to generate the surrogate model based on performance score metric values that are outputs from previously simulated test scenarios, and iteratively generate a plurality of test scenarios based on the surrogate model of the autonomy software under test. In this regard, each test scenario may have a defined set of mission parameters, environmental parameters, and vehicle parameters. To perform the adaptive search, the processing circuitry may also simulate the plurality of test scenarios on the autonomy software under test to generate performance score metric values for each test scenario. According to some example embodiments, the processing circuitry may also be configured to cluster the plurality of test scenarios based on the performance score metric values to determine the performance boundaries for the autonomy software under test. In this regard, the performance boundaries may be defined as boundaries between performance modes where less than a threshold change in one of the mission parameters, the environmental parameters, and vehicle parameters results in a test scenario having performance score metric values corresponding to a different performance mode. Each performance mode is associated with an outcome category for the test scenarios. The processing circuitry may be further configured to rank the plurality of test scenarios based on a respective distance to a performance boundary to identify test scenarios of interest for real-world field testing. The real-world test implementation system may be configured to receive a subset of the plurality of test scenarios from the apparatus and apply the subset of the plurality of test scenarios to an instance of the autonomy software operating on the real-world test implementation system to validate the autonomy software.

BRIEF DESCRIPTION OF THE SEVERAL VIEWS OF THE DRAWING(S)

Having thus described some example embodiments in general terms, reference will now be made to the accompanying drawings, which are not necessarily drawn to scale, and wherein:

DETAILED DESCRIPTION

Figure 1:
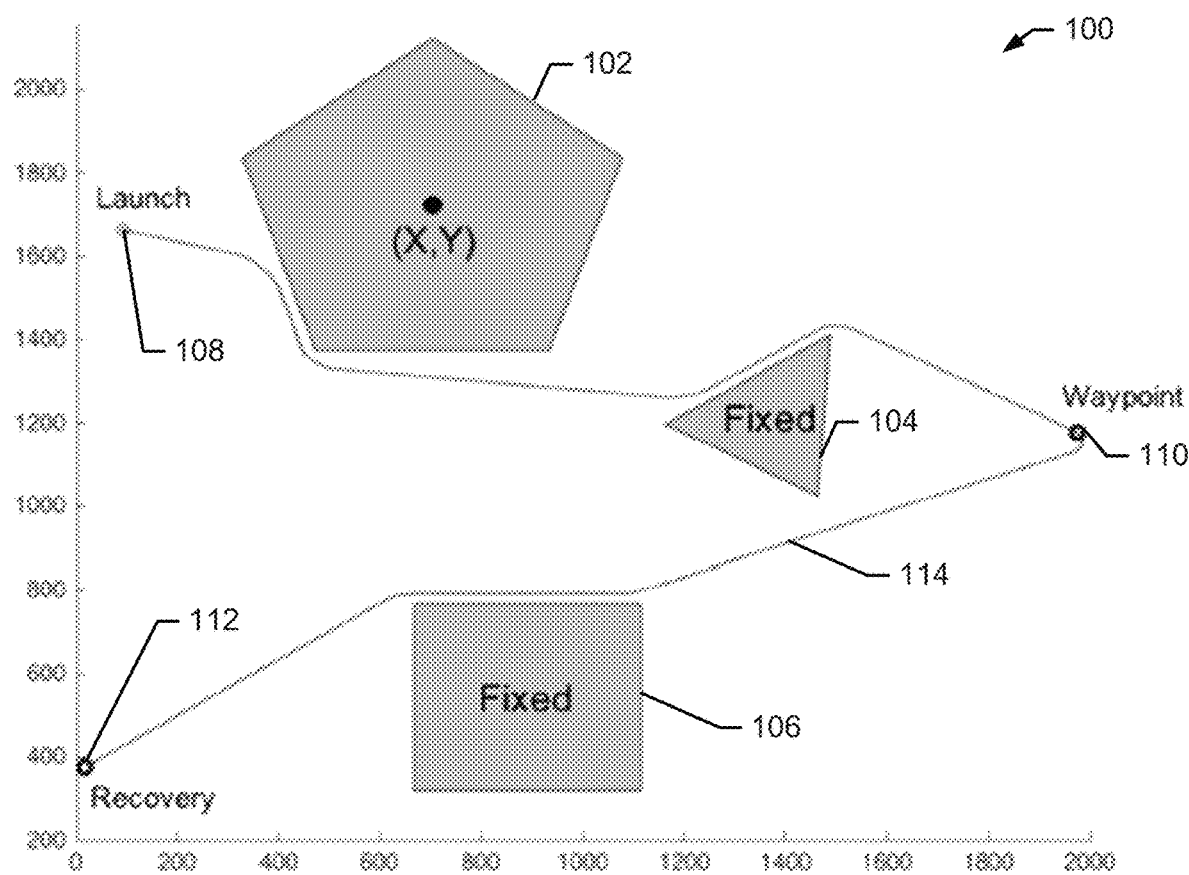
FIG. 1 illustrates an example portion of a state space and an associated test scenario simulation run according to some example embodiments.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout. As used herein, operable coupling should be understood to relate to direct or indirect connection that, in either case, enables functional interconnection of components that are operably coupled to each other.

According to some example embodiments, methods, apparatuses, and systems are provided for simulation testing of decision-making engines in a relatively high-speed and effective manner to determine performance, including simulation testing of decision-making engines to determine performance boundaries of the engines, such as autonomous vehicle control software (i.e., autonomy software). In this regard, some example embodiments may be configured to perform simulation testing of an autonomy software, also simply referred to as an "autonomy". To do so, some example embodiments employ an adaptive search approach using a surrogate model to identify test scenarios that are likely to be near performance boundaries, where, as further described below, relatively minor changes in the test scenario result in a different outcome (e.g., success, failure, etc.). The test scenarios may be applied to an autonomy under test to generate outputs in the form of scores for various output metrics. The scores may be considered within a scoring space and clustered with nearby scores to determine relationships between the test scenarios and to define the performance boundaries of the autonomy under test.

Based on a distance to one of the performance boundaries, the simulated test scenarios may be ranked to identify scenarios of interest to assist with modifying the autonomy or with defining scenarios for real-world field testing and validation of an autonomy for an autonomous vehicle.

In addition to other technical benefits described below, the use of an adaptive search to select scenarios for simulation significantly reduces the number of scenario simulation runs that need to be performed to develop an understanding of the performance of the autonomy under test. As indicated above, a technical problem with conventional approaches is that too many (or even all possible) scenarios need to be simulated in order to determine performance, requiring extreme amounts of time. Accordingly, in some example embodiments, the number of simulated test scenarios may be substantially reduced due to employment of a more targeted approach to test scenario selection relative to conventional approaches. As such, some example embodiments improve upon conventional approaches by improving the performance of testing computer systems, since a similarly detailed description of the autonomy's performance can be determined exponentially faster than was previously available, thereby using less computer processing and memory resources.

More specifically, according to some example embodiments, a method for determining performance boundaries of a decision-making software under test may include receiving, at processing circuitry, mission parameters indicative of a test mission, and receiving, at the processing circuitry, environmental parameters and vehicle parameters. The processing circuitry may then perform an adaptive search using a surrogate model of the autonomy under test to selectively generate a collection of test scenarios for simulation. The adaptive search approach may comprise generating the surrogate model based on performance score metric values that are outputs from previously simulated test scenarios, and iteratively generating a plurality of test scenarios based on the surrogate model of the autonomy under test. In this regard, each test scenario may have a defined set of mission parameters, environmental parameters, and vehicle parameters. Further, the adaptive search approach may also include simulating the plurality of test scenarios on the autonomy under test to generate performance score metric values for each test scenario. Upon simulating each of the test scenarios, clustering may be performed by the processing circuitry to group or cluster the plurality of test scenarios based on the performance score metric values and determine the performance boundaries for the autonomy. In this regard, the performance boundaries may be defined as boundaries between performance modes where less than a threshold change in one of the mission parameters, the environmental parameters, and vehicle parameters results in a test scenario having performance score metric values in a different performance mode. Further, the performance boundaries may define regions that are performance modes, and each performance mode may be associated with an outcome category for the test scenarios. Further, the plurality of test scenarios may be ranked based on a respective distance to a performance boundary to identify test scenarios of interest for modification of the autonomy or real-world field testing of an autonomous vehicle.

As such, according to some example embodiments, a simulation framework may be defined that selectively determines test scenarios for simulation to reduce a number of simulation runs needed to define the performance of decision-making software, such as autonomy software. Such a framework may be capable of exercising the autonomy realistically and determining a suite of test scenarios that provide coverage of the operating space. Within this ideology, a test scenario may be a single sample of the entire testing space. To increase the efficiency, test scenarios may be selected that will be simulated with the goal of obtaining the maximum amount of information about the autonomy under test. To do this, performance boundaries may be considered. Performance boundaries may be defined as regions in the testing space where relatively small changes in a test scenario (e.g., less than a defined threshold change) result in transitions between performance modes. In this regard, performance modes may be defined as discrete types of outcome behaviors that can be derived from observable output metrics.

A canonical example for consideration is how a small change to the position of an obstacle can cause the system to take a different path and fail to reach its goal. In this regard, FIG. 1 illustrates an example portion of a state space 100 in which a testing scenario may be run (or tested against). The portion of the state space 100 shown in FIG. 1 may be defined by physical, geographical parameters of the state space 100, while additional parameters that define the state space 100 may be in other dimensionalities and therefore not visualized in FIG. 1. In this regard, this portion of the state space 100, for example, may be defined with respect to geographic axes that may be referenced to indicate the position of items relative to an origin.

In an autonomy test, a test scenario may be defined with respect to a set of parameters within the state space. The parameters may be fixed (i.e., the same in all scenarios) or the parameters may be dynamic (i.e., a parameter may be different in at least some scenarios). A test scenario may be defined with respect to a set of parameters that include parameters that are constant and parameters that may differ in value in other scenarios. Various parameters may be defined that may include static or fixed parameters and dynamic parameters. In this regard, for example, environmental parameters may be defined. Environmental parameters may define obstacles or conditions in the state space 100 that may impact the decisions made by the autonomy. Examples of environmental parameters may include the static or fixed locations of obstacles (e.g., buildings, trees, vehicles, pedestrians, buoys, etc.) and conditions (e.g., weather conditions, such as, temperature, rainy, windy, etc., time of day (e.g., indicating light or dark), tides, currents, etc.). For example, in the state space 100, obstacles 102, 104, and 106 may be defined by environmental parameters, with obstacle 102 being a moving obstacle and obstacles 104 and 106 being fixed position obstacles. Additionally, vehicle parameters may be defined that may be associated with attributes of the vehicle being navigated. Such vehicle parameters may include, for example, aerodynamics, variable speed, weight, maneuverability, terrain capabilities, fuel capacity (which may be indicative of range), or the like. Also, mission parameters may be defined with respect to goals that are necessary to complete in order to satisfy requirements of the mission in its entirety. In some scenarios, the mission parameters may simply define a starting or launch point and a destination. In some scenarios, other mission parameters may be defined such as intermediate destinations or waypoints that must be visited prior to reaching the destination. In some instances, the mission parameters may define an order in which the multiple waypoints must be visited and may define whether a complete stop at the waypoint is necessary or a moving pass of the waypoint is sufficient. Other mission parameters may also be defined such as avoiding collisions and maintaining defined distances from obstacles based on mission safety standards. Additionally, dynamic mission parameters may be defined that could change based on certain circumstances that might arise during execution of the mission. In the example test scenario shown in the portion of state space 100, the mission parameters define a launch point 108, a waypoint 110, and a recovery or destination point 112.

As such, the mission associated with FIG. 1 is to travel from the launch point to the waypoint and then to the recovery point. As indicated above, a dynamic environmental parameter in the state space 100 is the (X,Y) position of the pentagonal obstacle 102. As further described below, a test scenario may be run through the autonomy with the obstacle 102 at one position and the results of the run may be scored in accordance with defined performance scoring metrics. Different scenarios may then be run with the dynamic parameter, i.e., the position of the obstacle 102, at a different value to determine additional performance scoring metric values for the various runs. In the example shown in FIG. 1 for a given autonomy, the decisions made by the software for a run where obstacle 102 is centered at (700, 1700) may cause a vehicle to navigate along path 114 where the vehicle reaches both the waypoint 110 and the recovery point 112.

In view of the test scenario, the autonomy may be scored based on whether the vehicle reaches the waypoint 110 and recovery point 112. In an embodiment, the path 114 satisfies both related metrics. In consideration of the state space 100 defined by the parameters described above, four outcomes (or performance modes) may defined for this example system. The four performance modes may be: (1) total success (TS) for reaching the waypoint 110 and the recovery point 112; (2) mission success (MS) for only reaching the waypoint 110; (3) safety success (SS) for only reaching the recovery point 112; and (4) total failure (TF) for reaching neither the waypoint nor the recovery point. The following describes some runs of test scenarios that result in different performance modes occurring.

Figure 2:
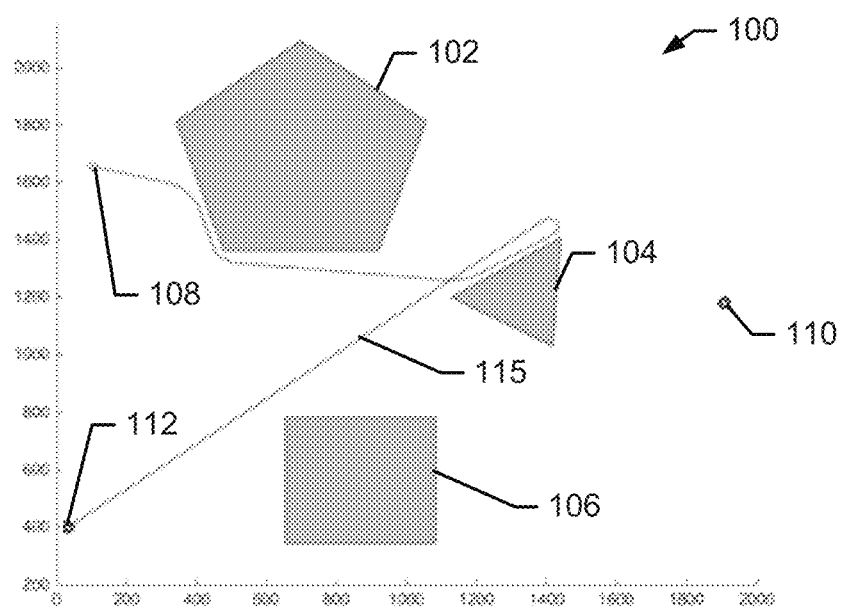
FIG. 2 illustrates the example portion of a state space of FIG. 1 with a different test scenario simulation run according to some example embodiments.

In the test scenario depicted in FIG. 2, the obstacle 102 has been moved slightly with respect to its position in FIG. 1. such that the obstacle 102 is centered at (675, 1700). As can be seen in FIG. 2, as a result of this relatively minor change, the autonomy causes the vehicle to navigate along path 115, which does not reach the waypoint 110, but does ultimately arrive at the recovery point 112. As such, the position of the obstacle 102 in FIG. 2 results in a run having a performance mode of safety success (SS), as described earlier.

Figure 3:
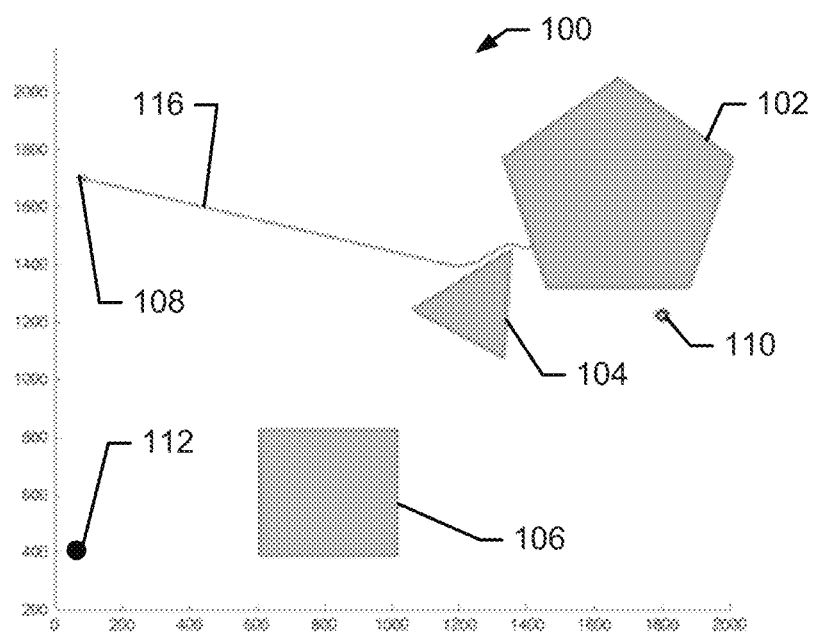
FIG. 3 illustrates the example portion of a state space of FIG. 1 with a another different test scenario simulation run according to some example embodiments.

In the test scenario depicted in FIG. 3, the obstacle 102 has been moved such that the obstacle 102 is centered at (1700, 1700). As can be seen in FIG. 3, as a result of this change, the autonomy causes the vehicle to navigate along path 116, which does not reach the waypoint 110 or recovery point 112. As such, the position of the obstacle 102 in FIG. 3 results in a run having a performance mode of total failure (TF), as described earlier.

Figure 4:
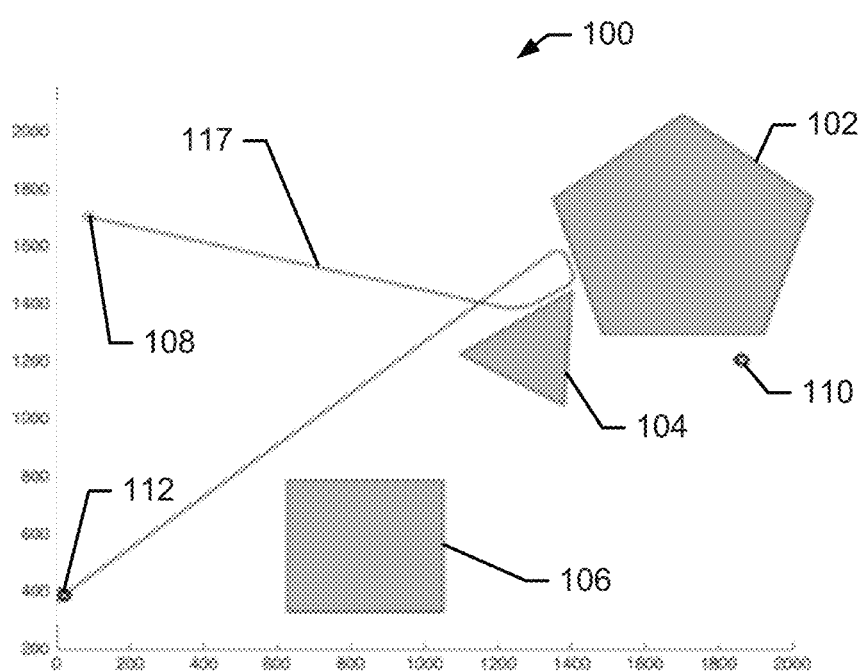
FIG. 4 illustrates the example portion of a state space of FIG. 1 with yet another different test scenario simulation run according to some example embodiments.

In the test scenario depicted in FIG. 4, the obstacle 102 has been moved slightly with respect to its position in FIG. 3 such that the obstacle 102 is centered at (1725, 1700). As can be seen in FIG. 4, as a result of this relatively minor change, the autonomy causes the vehicle to navigate along path 117, which does not reach the waypoint 110, but does ultimately arrive at the recovery point 112. As such, the position of the obstacle 102 in FIG. 4 results in another run having a performance mode of safety success (SS), as described earlier.

Figure 5:
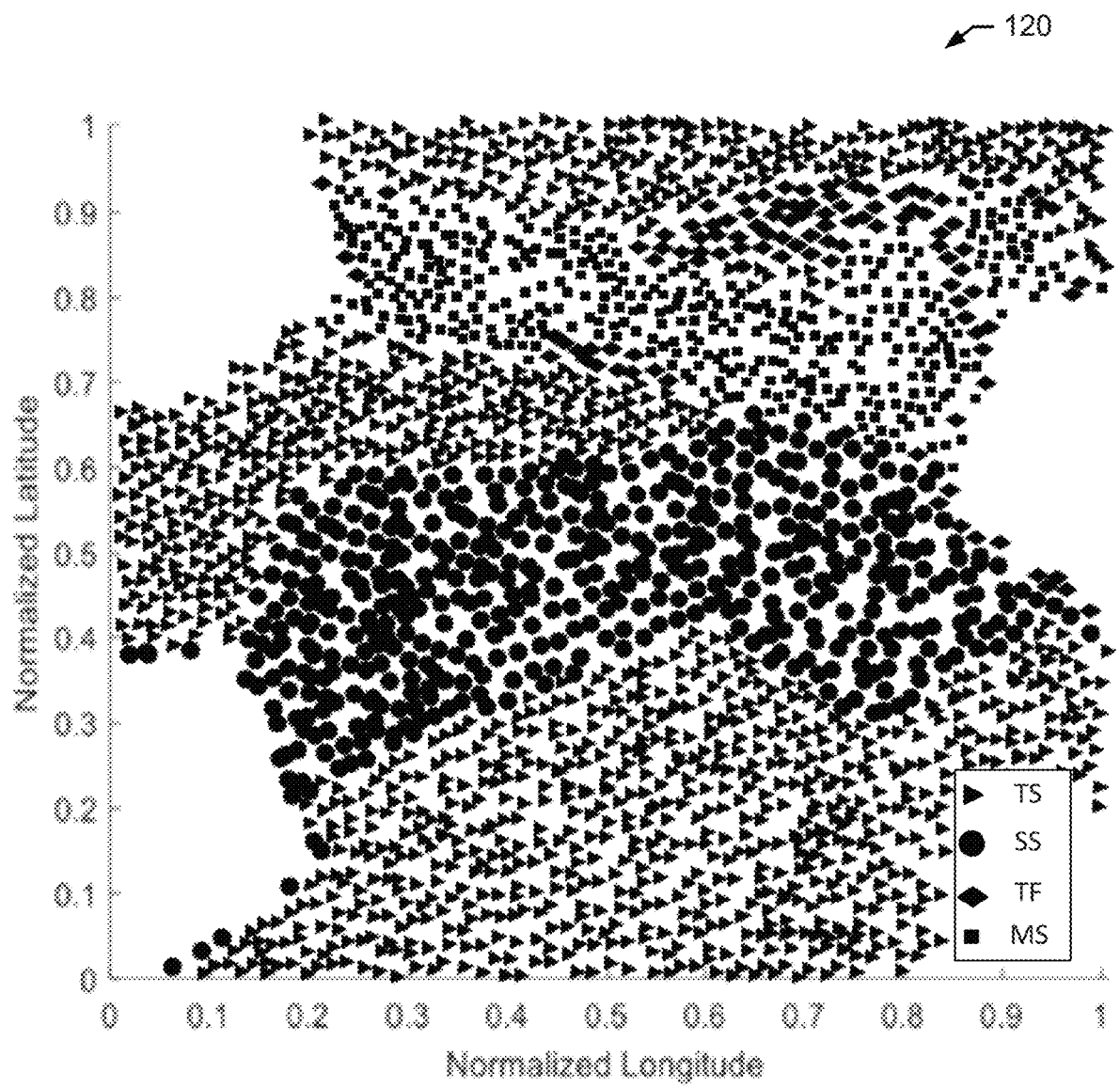
FIG. 5 illustrates an example performance plot according to some example embodiments.
Figure 6:
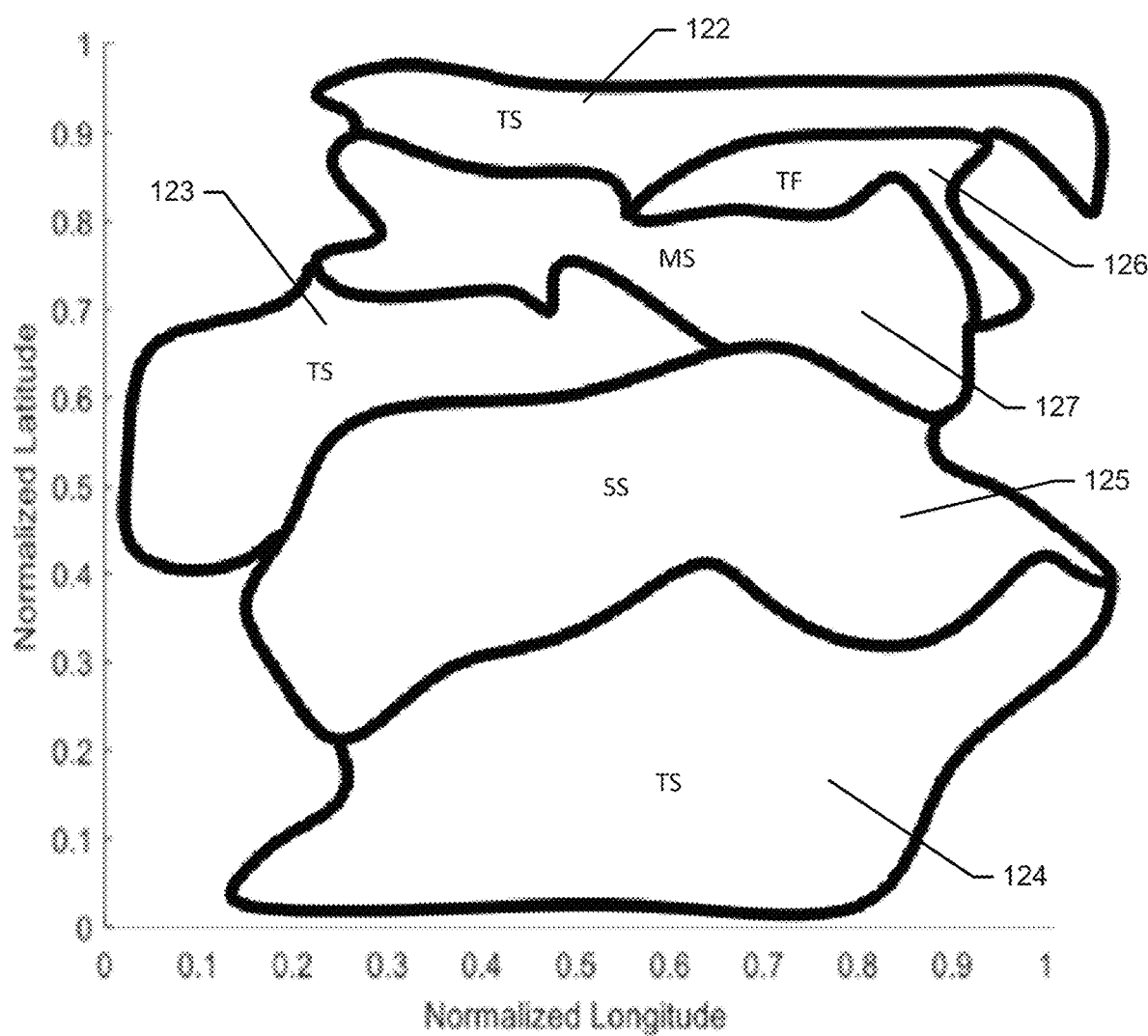
FIG. 6 illustrates an example performance region chart according to some example embodiments.

Considering these example scenarios, it can be seen that numerous scenarios may be run by the autonomy to generate results in the form of performance scoring metrics that may be, for example, representative of various performance modes and considered in a results scoring space. In this regard, FIG. 5 shows an example performance plot 120 of the results of numerous test scenarios associated with the system shown in FIGS. 1 to 4. In the performance plot 120, the axes are defined with respect to a normalized position (e.g., longitude and latitude) of the movable obstacle 102. In this regard, the performance mode results can be visualized with each run of a test scenario resulting in a performance mode result as indicated by the corresponding shape in the plot and the position of the obstacle 102. Using clustering, in accordance with some example embodiments, the results can be grouped and performance boundaries between the performance mode regions can be defined. As shown in FIG. 6, and in accordance with this example, performance mode regions 122, 123, and 124 may be defined by associated boundaries for the total success performance mode. Further, performance mode region 125 may be defined by associated boundaries for the safety success performance mode. Performance mode region 126 may be defined by associated boundaries for the total failure performance mode, and performance mode region 127 may be defined by associated boundaries for the mission success performance mode.

Additionally, as described in further detail below, boundary pairs of test scenarios may be identified and ranked as being of high value. Boundary pairs are scenarios that have differences in parameters that are less than a given threshold (e.g., less than a given difference or delta between parameters), but one of the scenarios results in a first performance mode and the other of the scenarios results in a different second performance mode. In this regard, the scenario shown in FIG. 1 may be a boundary pair with the scenario shown in FIG. 2, due to the relatively minor difference (e.g., less than a threshold difference) in the position of the obstacle 102 and the fact that the each of the scenarios results in a different performance mode (i.e., a TS/SS boundary pair). Similarly, the scenario shown in FIG. 3 may be a boundary pair with the scenario shown in FIG. 4, due to the relatively minor difference (e.g., less than a threshold difference) in the position of the obstacle 102 and the fact that the each of the scenarios results in a different performance mode (i.e., a TF/SS boundary pair). Such boundary pairs can be valuable to evaluate because they indicate a presence of a performance boundary and can be used as a guide to locate additional boundary pairs to define the performance boundary more broadly. Also, in general, scenarios that have results near the performance boundaries are of increased interest for performance evaluation relative to scenarios that have results located more centrally with respect to a performance mode region. With respect to testing, scenarios that lie along such performance boundaries are high-value because they may evoke significant behavior and decision changes made by the autonomy. Due to the approach and the treatment of the autonomy as a black box, determining where these boundaries or transitions occur can assist with predicting the performance of the system and is useful for both design, i.e., fixing software bugs, and for validation purposes, i.e., understanding the likelihood of triggering certain behaviors in different regions of the testing space. Furthermore, scenarios that lie along performance boundaries may also be some of the most sensitive to changes in the system. Thus, identifying such scenarios may be useful for determining the performance regression between software versions of the autonomy.

With a goal of discovering performance boundaries of a decision-making engine, such as an autonomy, some example embodiments are able to reduce the total number of simulation runs required by tailoring the scenario generation techniques to preferentially sample scenarios where performance boundaries are predicted to occur. As such, according to some example embodiments, a novel adaptive search technique is provided that is designed specifically to find test scenarios that are likely to be near performance boundaries, with a particular focus on the ability of the search to scale to a high number of samples and high number of dimensions. In addition, according to some example embodiments, performance boundaries can also be verified in the resulting performance metrics from the scenario runs through unsupervised clustering techniques.

As such, according to some example embodiments, systems, apparatuses, and associated methods for generating test scenarios for any autonomous system utilizing software-in-the-loop simulation and adaptive sampling are provided. In this regard, according to some example embodiments, such implementations may be referred to as a Range Adversarial Planning Tool (RAPT). A goal of example embodiments implementing the RAPT can be to assist test engineers by helping them understand the decision-making process of an Autonomy Under Test (AUT) and aid in designing a final suite of tests for field testing. As such, a simulation-based testing framework is provided, according to some example embodiments, that may be applicable to any autonomous system.

According to some example embodiments, selection and receipt of parameters for a scenario, by, for example, a computer system employing processing circuitry may be performed to initiate a test generation process. A parameterized scenario may be created and ranges for the dynamic parameters may be considered to define the testing state space, hereafter referred to simply as the state space. As described above, examples of scenario parameters used in search-based generation techniques may include, for example, obstacle configurations for ground vehicles, sensor ranges in self-driving car applications, and ranges of relative bearings, and distances for aircraft encounters. According to some example embodiments, the state space may be defined by a set of configuration files (also known as state space files) that may describe the environmental parameters, mission parameters, and vehicle parameters. These parameters may include dynamic parameters that are defined, for example, with respect to ranges, such as the time of day, the number and location of obstacles, different mission types, etc. The number of variable simulation parameters in the state space can constitute the dimensionality of the state space. Individual scenarios which are passed to the simulator may be created based on specific instantiations of each parameter within their respective state space ranges for the dynamic parameters.

A performance score space of the autonomy may also be defined. Since, according to some example embodiments, a reasoning component of the AUT may be treated as a black box, metrics may be defined upon which the AUT is scored based on, for example, externally observable attributes that may be defined as performance scoring metrics. Such performance scoring metrics may include binary metrics, such as mission completion/failure, discrete metrics, such as the number of safety violations, or continuous metrics, such as the amount of fuel consumed. While some performance scoring metrics may produce continuous values, the metrics may, according to some example embodiments, be mapped to discrete behaviors or performance modes based on threshold values as described above, such as, for example, waypoint success based upon reaching a specific distance from the waypoint. According to some example embodiments, the definition of the performance score space and accordingly the performance metrics need not require a user to define an objective function, which can be difficult to design and can require careful tuning of the scoring parameters. Alternatively, according to some example embodiments, implementations of the framework described herein can support an arbitrary number of performance score metrics, noting, however, that the score space may be defined with respect to a high number of dimensions. The number of performance modes that will be identified can increase accordingly, which may dilute a scenario search.

The target system under test (SUT) may be a simulation of the AUT performing the mission described in the state space files. The SUT, according to some example embodiments, may take scenarios or scenario states from the test-generation system as an input and convert the scenario states into scenario files that may be read by a simulator. According to some example embodiments, a job scheduler may manage a transfer of scenario files, launch the simulations on a computing cluster (e.g., processing circuitry), and retrieve results from completed runs. Such jobs may be submitted in batches tailored to the size and speed of the computing cluster. After the simulations are complete the results may be scored and returned to the test-generation system to assist in further selection of the test scenarios.

Once the submitted scenarios have been run by the simulator, the performance modes and associated performance boundaries may be identified and the test scenarios may be ranked based on their distance from the performance boundaries. In addition, sets of boundary pairs may be identified that represent different types of performance transitions. For example, one set of boundary pairs may describe examples of the AUT on the boundary between completing and failing a mission, while another boundary pair may describe examples of the AUT on the boundary between successfully returning home and running out of battery or fuel. Each boundary pair of scenarios across a performance boundary may have minimal parameter differences, thereby providing important information regarding the relevant features that instigated the transition in performance modes.

Figure 7:
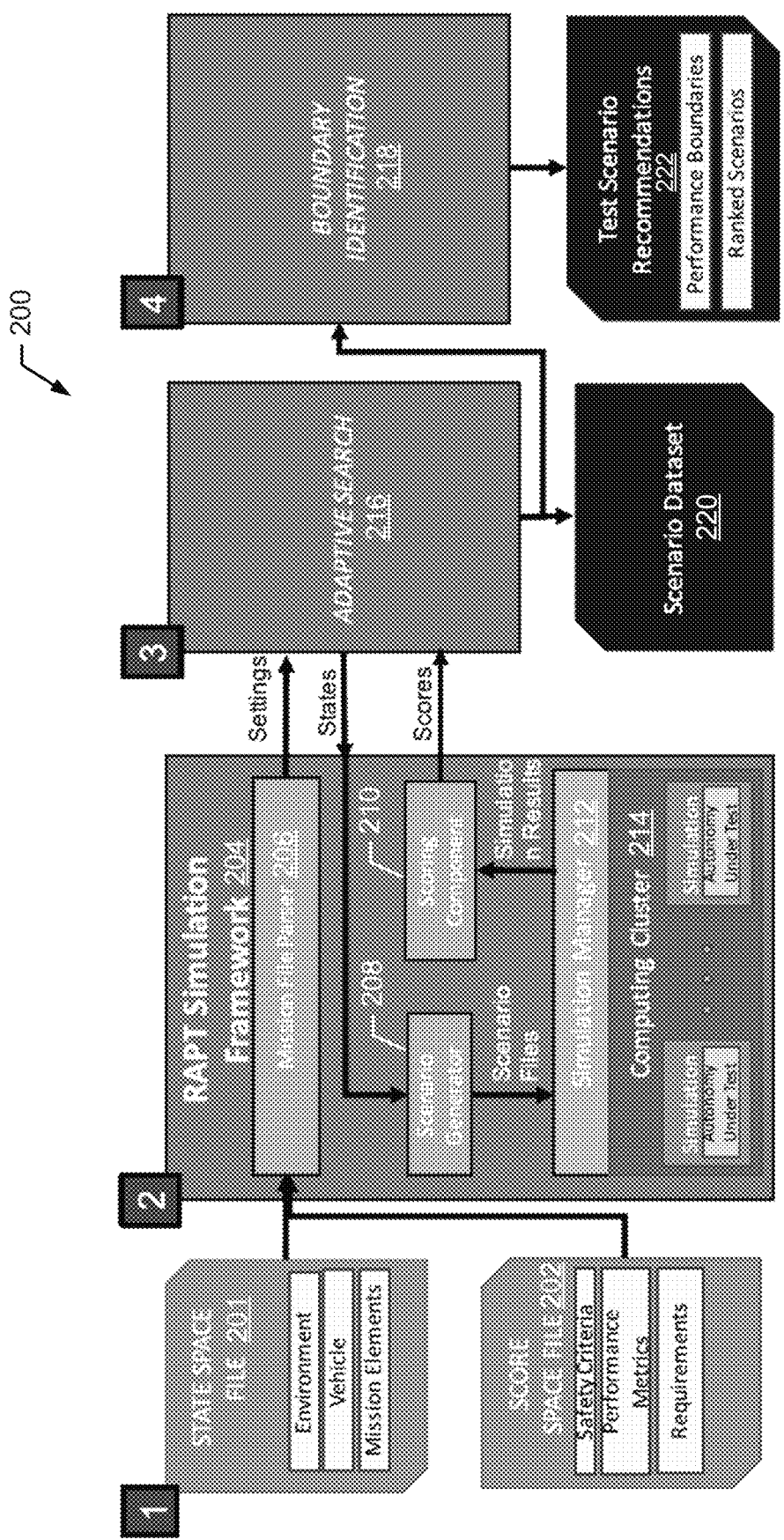
FIG. 7 illustrates an example flowchart for determining decision-making engine performance according to some example embodiments.

Based on the foregoing and with reference to FIG. 7, an example flowchart 200 describing a method for implementation by an apparatus or system that determines performance of a decision-making engine, such as an autonomy, is shown. As described above, a state space may be defined in the form of, for example, a state space file 201. The state space file 201 may be defined with respect to parameters, such as, for example, environment, vehicle, and mission parameters (or elements). The state space file 201 includes parameters that define the mission to be simulated in consideration of various other parameters. Further, a score space may be defined in the form of a score space file 202. The score space file 202 may be defined with respect to performance scoring metrics. In this regard, according to some example embodiments, the score space file 202 may be defined by safety criteria, requirements, and performance metrics. The score space file 202 may therefore define how, for example, vehicle performance may be scored. The state space file 201 and the score space file 202 may be inputs that are passed to the RAPT simulation framework 204.

The RAPT simulation framework 204 may generally be configured to manage the launching of test scenario simulation runs and the parsing of results from those runs. In this regard, the RAPT simulation framework 204 may receive the state space file 201 and the score space file 202 for evaluation and parsing by a mission file parser 206 for conversion into settings. Such settings may be received by the adaptive search 216. The adaptive search 216 may be performed, as described in further detail below, using the settings to output test scenario states. The states may be received by the scenario generator 208 to generate scenario files for a test scenario (or a batch of test scenarios) to be passed to the simulation manager 212. The simulation manager 212 may be configured to receive and manage the simulation of the test scenarios described in the scenario files. In this regard, the simulation manager 212 may employ a computer cluster (e.g., processing circuitry) to perform the simulations on an autonomy under test. Depending on the processing power, multiple simulations of the autonomy under test may be implemented to, for example, perform parallel simulation runs to increase efficiency. The results of the simulation runs may be passed to a scoring component 210 to convert the results into desired scores (e.g., values for performance score metrics). Those scores may be passed to the adaptive search 216.

The adaptive search 216 may use the scores to generate new test scenario states that are likely to be near a performance boundary and pass the new test scenario states to the scenario generator 208, to ultimately be simulated to generate scores for iterative evaluation by the adaptive search 216. The adaptive search 216 may provide, as an output, a set of test scenarios (i.e., scenario dataset 220), which may be a collection of scenarios that include identified boundary pairs. The adaptive search 216 may also provide information about the test scenarios, including the performance scoring metrics of the simulated scenarios, for clustering by the boundary identification 218 as further described below. The boundary identification 218 may provide outputs as test scenario recommendations 222 for use in, for example, real-world application in an autonomous vehicle. Further, the test scenario recommendations 222 may include definitions of the determined performance boundaries, and ranking of the test scenarios.

In view of this operational flow, it can be seen that, according to some example embodiments, the AUT and its simulation environment may be treated as a monolithic system-under-test (SUT) which accepts scenarios as input and returns a final performance scores as outputs. While the approach shown in the flowchart 200 is applied in the context of autonomy testing, according to some example embodiments, a similar approach could be utilized with the any type of decision-making engine being simulated under test. Therefore, the approach allows for generalizing to any black-box system where sharp transitions or discontinuities in the output space are the region of interest.

The following provides a more detailed description of an example approach in view of the foregoing with additional depth with respect to the defined terms and operations. In this regard, the scenario configuration state space may be defined as $x^n=[x_1, \ldots, x_n]$ having n elements (or parameters). Each element in the state space vector represents a variable in the environment, mission, or vehicle parameters with a range of possible values (obstacle positions, time windows, mission priorities, etc.). The state space may be a continuous, real-valued metric space where the distance between points (i.e., scenarios) may represent the similarity between their configurations or similarity between their collective elements or parameters. To accommodate such requirements, a scenario generator function $\kappa: X \to S_0$ may be defined which maps the state space into a specific input state utilized by the simulation environment. This enables application of the system to scenarios with categorical parameters to generate values for non-uniform distributions.

Additionally, a scenario input state or test scenario may be defined as the vector $X=[x_1, x_2, \ldots x_n]$ where $\forall i \in n: x_i \in X_i$. The scenario may be a specific instantiation of each parameter from their corresponding state space range. Thus, the state space may consists of all the possible scenario configurations that could be tested. A sample set of N states may be defined as $X^N=[X_1 \ldots X_N]$. The normalized state vector where each $\bar{x}_i \in [0, 1]$ is defined as $\bar{x}$.

The performance score space may be defined as $y^m$ of m parameters where each output score is defined as the vector $Y=[y_1, y_2, \ldots y_m]$. Each element in the score vector may represent a performance scoring metric by which the autonomy can be evaluated, such as, for example, percentage of fuel consumed or number of waypoints reached. A sample set of N score vectors is defined as $Y^N=[Y_1, \ldots, Y_N]$. The normalized score vector where each $\bar{y}_i \in [0, 1]$ can be defined as $\bar{Y}$. In order to compute the score, a scoring function $\lambda: s_f \to y$ may be defined which takes the output of the completed simulation and computes the score based on the selected metrics.

A black box system-under-test (SUT) function $\mathcal{F}(X^N)=Y^N$ may also be defined that accepts a set of N input states $X^N=[X_1 \ldots X_N]$ and returns a sample set of N score vectors $Y^N=[Y_1 \ldots Y_N]$. As such, a scenario configuration may be provided as an input, the simulation may be run until completion, and the scoring metrics may be received against the history of the simulation as an output. The scenario generator function K and scoring function $\lambda$ may be incorporated as part of the SUT.

A performance mode may be formally defined as $\mathcal{P} \subset Y^m$ where $\cup_i \mathcal{P}_i = Y^m$ and $\forall i \neq j, \mathcal{P}_i \cap \mathcal{P}_j = \emptyset$. In other words, a performance mode may be a category of scores which represent a distinct type of performance for the SUT.

The boundary region $B_{a,b} \subset X$ between performance modes $\mathcal{P}_a$ and $\mathcal{P}_b$ may be defined as the region where $\forall X_{i,a} \in B_{a,b}, \exists X_{j,b} \in B_{a,b}$ s.t. $|X_{i,a}-X_{j,a}|<D_\epsilon$ and vice versa. An example boundary region 250 based on this definition is provided in FIG. 8, with a performance boundary 252 disposed between the performance modes. The $D_\epsilon$ may be the width of the boundary region and the set of all boundaries that exist for the SUT in question may be referred to as B.

A boundary pair $b_{i,j} \in B_{a,b}$ is a set of two scenarios each of which is the other's closest neighbor in a different performance mode. The boundary pair may be defined as $b_{i,j}=[X_i, X_j, Y_i, Y_j]$ where $|X_i-X_j|=D_{ij}<D_\epsilon$, $X_i, X_j \in X^N$, and $Y_i \in \mathcal{P}_a$, $Y_j \in \mathcal{P}_b | a \neq b$.

The sampled boundary region may be defined as $S_{a,b}(X^N, D_\epsilon) \subset B_{a,b}$ where $\forall X_i \in S_{a,b}(X^N, D_\epsilon), \exists X_j \in X^N$ such that $|X_i-X_j|<D_\epsilon$ and $X_j \in B_{a,b}$.

With these definitions established, a search function can now be defined according to some example embodiments. In this regard, the search function may be defined as $\Gamma(\mathcal{F}, x^n, y^m, N)=\mathcal{L}^N$ where N is the number of samples allocated to the search, which may be provided, for example, as a user-defined input. The output, $\mathcal{L}^N$, may be a set of labeled samples $\mathcal{L}^N=[X^N, Y^N]$ consisting of the queried states $X^N$ and their respective scores $Y^N$.

A boundary identification algorithm may be defined as a function $C(\mathcal{L})=B$ which may accept a set of labeled samples, $\mathcal{L}^N$, and return the set of identified performance boundaries: $B=[B_{1,2}, B_{1,3}, \ldots, B_{L-2,L}, B_{L-1,L}]$ where L is the number of identified performance modes and N is the number of samples in $\mathcal{L}^N$. Each boundary $B_{a,b}$ may be the set of samples that borders the performance modes $\mathcal{P}_a$ and $\mathcal{P}_b$.

Figure 8:
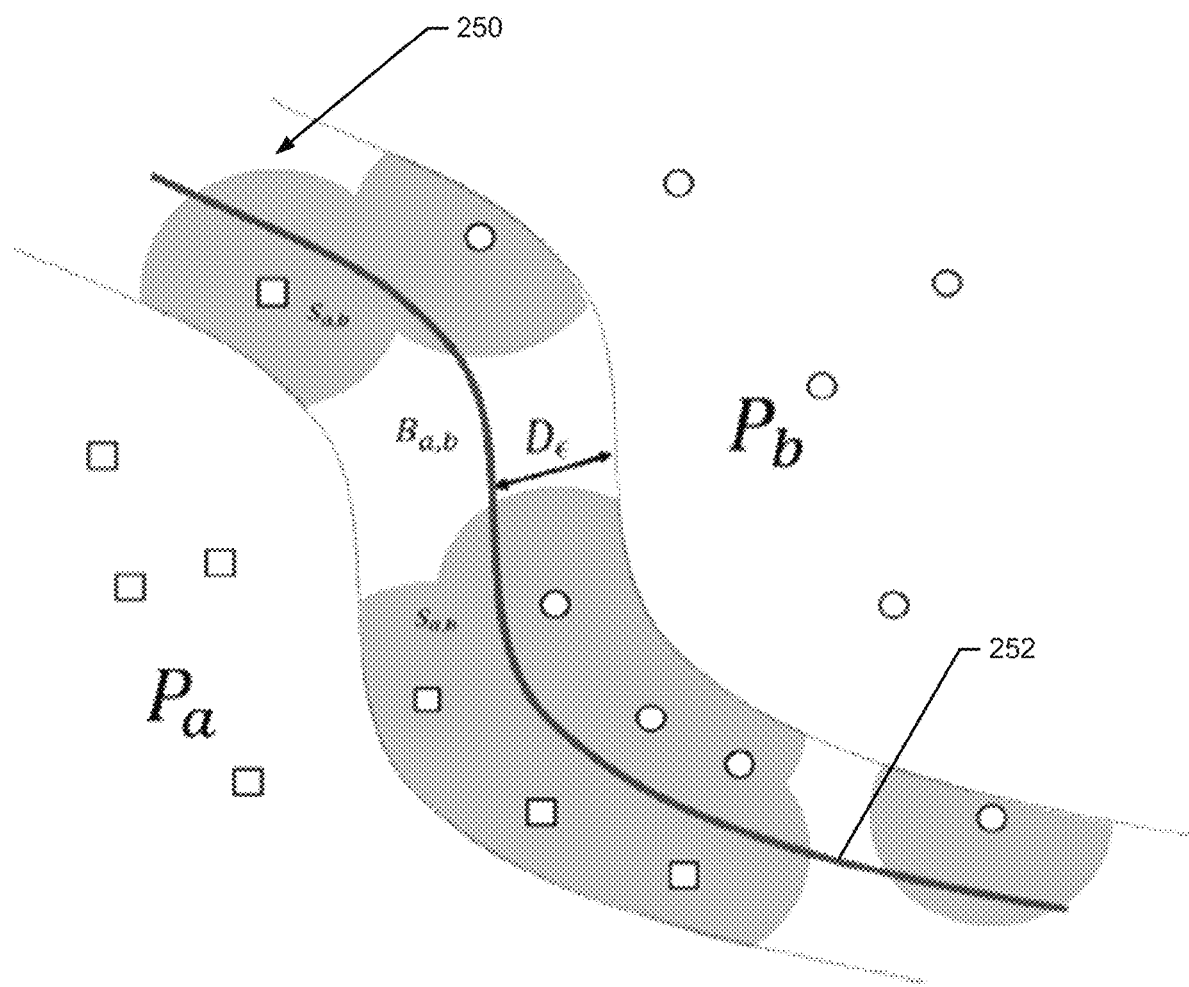
FIG. 8 illustrates an example boundary region according to some example embodiments.

According to some example embodiments, an objective is to generate a set of samples that define the performance mode regions where performance boundaries occur with the greatest resolution possible. In other words, an objective is to generate a set of samples $X^N$ which maximizes the volume of the sampled boundary regions $S_{a,b}(X^N, D_\epsilon)$ for all boundaries in B for the smallest possible value of $D_\epsilon$ as illustrated in FIG. 8. The quality of the generated dataset may be rated with respect to various criteria. For example, one criterion may be efficiency. The efficiency criterion may be defined as the ability to discover the performance boundaries in the fewest number of samples to the SUT. Such efficiency may be helpful given a limited number of samples available to characterize realistic, high-dimensional state spaces. Efficiency may be measured using, for example, metrics for precision, convergence, and resolution. The precision metric may be defined as the percentage of samples which are within $D_\epsilon$ of a performance boundary. The convergence metric may be defined as the amount of queries necessary to acquire samples on all performance boundaries. The resolution metric may be defined as the distance of the samples from the nearest performance boundary.

Another criterion for rating the quality of the dataset may be diversity. In this regard, diversity may be defined as the ability to find representative scenarios from all the performance boundaries of the SUT, which may mean sampling uniformly across the entire region where the performance boundary occurs as well as achieving even distributions amongst all performance boundaries. Diversity may be measured based on metrics for coverage, class distribution, and boundary distribution. Coverage may be the percentage of the performance boundary regions that have been sampled. Class distribution may be the distribution of samples from the different performance modes. Finally, boundary distribution may be the distribution of samples from the different performance boundary types.

Another criterion for rating the quality of the dataset may be scaling. The ability to scale both with the dimensionality of the state space and the size of the sample set may allow for more general application of the techniques to a variety of different SUTs. The scaling criterion may be an indication of how these techniques perform as both the number of input dimensions and the number of samples increase. Scaling may be measured by evaluating the runtime properties and how previously defined efficiency and diversity metrics evolve as the number of samples and number of dimensions increases, particularly with respect to how the algorithms handle the inclusion of non-contributing variables in the state space.

As described above, the most informative scenario configurations for testing may occur in the transition regions between performance modes, previously referred to as the performance boundaries. The reasoning is that it may be inefficient to test the system in regions of the state space where performance is constant and known, for example, based on scenarios where the system will either almost surely succeed or almost surely fail. Much more useful information about the SUT may be gained by testing in regions where critical decisions must be made by the autonomy that result in variable performance (e.g., different performance modes).

Figure 9:
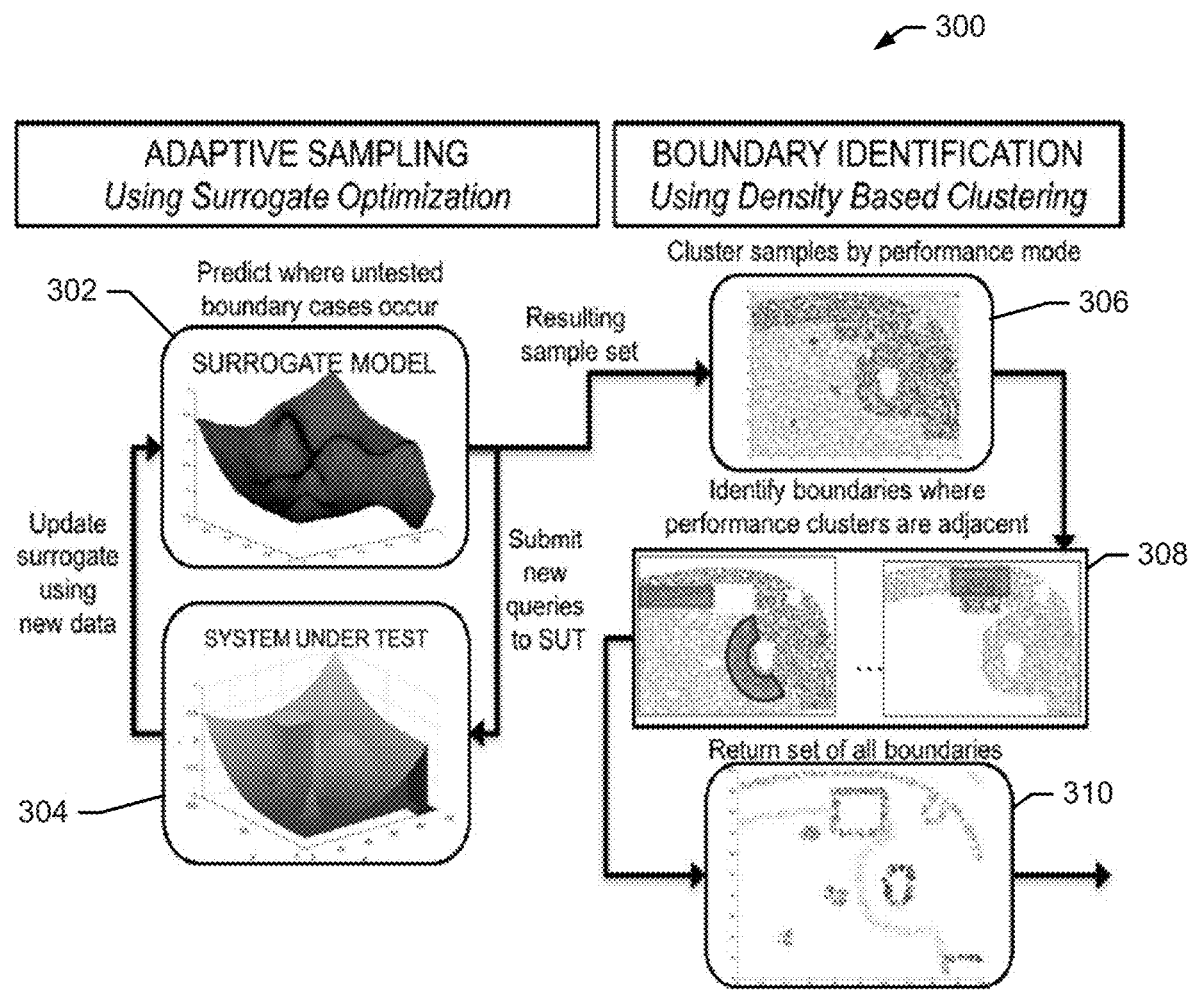
FIG. 9 illustrates an example flowchart for performing adaptive sampling and boundary identification according to some example embodiments.

Additionally, a conventional strategy of testing under worst-case conditions does not fully characterize the performance envelope of the system because there may be failure modes or performance boundaries that occur in regions other than worst-case conditions that are not immediately apparent. Given a user-defined state space, $X^N$, and a limited number of queries, N, to the autonomy simulation, one objective, according to some example embodiments, is to find the performance boundaries of the system. Since performance boundaries are where small changes in the state (or scenario parameters) cause a large change in the score (e.g., a different performance mode), this can also be conceptualized as large gradients or discontinuities in autonomy performance. To achieve this goal, the approach may be separated into two phases: search using adaptive sampling (also referred to as adaptive search), and boundary identification. These phases and their interaction can be visualized with reference to the example flowchart 300 shown in FIG. 9.

During the search phase, an adaptive sampling approach may be utilized to select new test scenarios that are run by the autonomy simulation. In this regard, adaptive sampling may be performed using surrogate model optimization. At 302, a surrogate model may be generated and used to predict where untested boundary cases occur. In the nature of adaptive sampling, the new test scenarios may be selected based on the performance score of the autonomy from previous simulations. As such, samples or queries may be generated based on the surrogate model 302 at locations that are likely to be near a performance boundary according to the surrogate model 302 of the SUT 304. These queries may be passed to the SUT 304 for simulation to update the surrogate model 302 using the new data from the new scenarios. As such, a modular adaptive sampling strategy may be used to model the autonomy performance as a surrogate model and preferentially select regions that might indicate performance boundaries using the model. The high dimensionality of any realistic state space for an autonomous system can make it intractable to simply perform an exhaustive spread of simulations as described earlier. Thus, searching the state space primarily on adequate coverage of the boundary regions using a iterative surrogate model approach may be performed to minimize the number of simulations.

In the identification phase, the resulting samples generated during the search phase may be clustered by performance mode at 306, for example, using a density based clustering technique. According to some example embodiments, the resulting samples may be used to identify the performance modes using, for example, unsupervised clustering algorithms. Once scenarios have been classified by their performance mode, the performance boundaries between the performance modes may be identified at 308, and the tested scenarios adjacent to boundaries can be used to aid in, for example, live test design. As such, at 310 the set of all performance boundaries may be returned.

With respect to the search algorithm, as described above, one objective is to create a high quality set of test scenarios given an allocated number of simulations. To do so, an informative and diverse set of test scenarios may be created. In this regard, the search algorithm may choose samples in areas that indicate the presence of a performance boundary, while also preventing oversampling by continuing to explore the state space with samples in untested regions. To do so, according to some example embodiments, an adaptive sampling approach may be employed to fully discover and characterize all possible performance boundaries (not just the most extreme ones that many multimodal optimization techniques would produce) and to avoid the need to develop an optimization objective function, which are notoriously difficult to design and are typically system dependent. Thus, by exploiting underlying features of the performance surface, the regions of interest may be discovered, allowing for a more general approach that does not require domain-specific knowledge.

According to some example embodiments, adaptive sampling may be performed as an iterative process comprising the submission of queries (or test scenarios) to the SUT, using the returned scores to generate a meta-model (or surrogate model), and then applying an information metric to the meta-model to generate a new set of queries. A generalized framework may therefore be utilized for adaptive sampling which may allow for changing the underlying meta-models and information metric. According to some example embodiments, a more formal defined algorithm for adaptive search is provided in Algorithm 1 below.

---
Algorithm 1: Adaptive Search (SUT, $\chi^n$, $\mathcal{M}$, N).
---
Input: A function representing the system under test $\mathcal{F}$,
    a scenario state space $\chi^n$, a meta-model evaluator $\mathcal{M}$,
    and a desired number of samples N
Output: A set of labeled samples $\mathcal{L}$
    Select a query batch size of L and an initial batch of
    randomly selected query states $X_0^L$. In addition, choose a
    number of proposed queries, p, to perform per iteration.
    for all i $\in$ [0, N/L] do
        $\mathcal{F}(X_i^L) = Y_i^L$
        concatenate($\mathcal{L}$, [$X_i^L$, $Y_i^L$])
        Train $\mathcal{M}$ on labeled sample set $\mathcal{L}$
        Randomly select a new set of proposed queries $X^p$ :
        p > L
        $X_{i+1}^L$ = argmax$_{X^L \subset X^p}\mathcal{M}(\overline{X}^L)$
    end for
    return $\mathcal{L}$
---

The adaptive sampling algorithm may use the normalized unit states $\overline{X}$ and scores $\overline{Y}$ for the information metrics. Multiple query strategies may be used for adaptive sampling including entropy, model improvement, uncertainty, and density. However, these strategies operate to maximize the accuracy of the underlying meta-model, rather than generate samples that exist near performance boundaries. Thus, metrics may be used to locate areas with high gradients that have not yet been sampled. Such metrics may include a Gaussian Process Regression (GPR) meta-model and one which uses a k-nearest neighbor technique for density and variance estimation.

Since the Gaussian process scales with $O(n^3)$ and the k-nearest neighbors algorithm scales with $O(kn \log n)$, these approaches may offer improved scaling as the number of dimensions and the required number of samples increases. These meta-model evaluators may be defined as $\mathcal{M}(\overline{X})$, where they take existing samples as inputs and return the expected information gain of a proposed query as an output. The GPR meta-model may use a zero mean function and a Maters-covariance function with nu=d/2 and an isotropic distance measure. Given a proposed query, the function may return the mean value $\mu$, the first-order gradient of the mean $\nabla\mu$, and the variance of the query $\sigma$. The Matern-covariance may be proportional to the distance to the nearest sample. As such, the variance in this case may provide an appropriate reflection of how far away the query is from one of the training samples. The GPR meta-model evaluator may use the magnitude of the gradient and uncertainty as follows:

$$\mathcal{M}_{GPR}(\overline{X}) = (|\nabla\mu(\overline{X})|)^g \cdot (\sigma(\overline{X}))^v$$

where g and v are tuning parameters to balance exploration of high uncertainty regions with high gradient regions.

The Nearest Neighbor Density and Variance (NNDV) evaluator may estimate the local properties of a query using its nearest neighbors. A k-nearest neighbors density estimate and variance estimate may be utilized to obtain the predicted variance $Y_K$ of the sample and its mean distance $d_K$ to its neighbors. The information may then be computed as follows:

$$\mathcal{M}_{NNDV}(\overline{X}) = (\sigma_K(\overline{X}))^g \cdot (d_K(\overline{X}))^v$$

where g and v are the same tuning parameters used in the GPR meta-model evaluator.

When dealing with systems that have categorical scores, a different variance measure may be used for the information function. For such systems, an "unlikeability" measure u may be utilized. This metric may be 1 when every element of the set is from a different category and 0 when all elements of a set are members of the same category. As such, the metric may be defined as follows, $$u = \frac{\sum_{i \neq j} c(x_i, x_j)}{n^2 - n}$$

where $$c(x_i, x_j) = \begin{cases} 1, & x_i \neq x_j \\ 0, & x_i = x_j \end{cases}.$$

For adaptive sampling, the meta-model evaluators may be used to select the subsequent batch of samples based on the set of queries with the highest expected information gain, as indicated in Algorithm 1. According to some example embodiments, the methods may retrain the meta-model evaluator at every iteration, which brings the computational complexity for the entire search process to $$o\left(\frac{n^4}{L}\right)$$

for the GPR meta-evaluator search and $$o\left(k\frac{n^2}{L}\log n\right)$$

for the NNDV meta-evaluator search where L is the number of samples in each batch. Accordingly, an improvement may implemented by utilizing meta-models which can be iteratively updated with new data, rather than being trained from scratch after each iteration.

With respect to sensitivity scaling, when applying the search techniques to a realistic SUT with a user-defined state space, a high number of input states and output scores may be used. Additionally, the state variables which actually contribute to the output of the system may be not known a priori. Reducing the range and dimensionality of the state space can result in a much more efficient and effective search by applying sensitivity analysis techniques that search, for example, only over the state variables which contribute to the system output and treat the remainder as independent noise. To do so, the range of each state may be scaled based on its input sensitivity. Thus, states with little importance appear to be identical with regard to the distance metric while the ranges of highly influential states may be magnified to provide a more focused search. According to some example embodiments, state sensitivities may be determined by fitting a classification tree to the data and computing variable importance VI(x). The computational complexity of training a classification tree is O(mn log n) where m is the number of input features. Thus, while computing the variable importance may add to the calculation, the overall complexity of the search algorithm may be same. The sensitivity-scaling information metric may therefore be given by $$M_{scaled}(\overline{X}) = \frac{1}{M} \sum_{i=0}^{M} M_{NNDV}(\overline{X} \circ VI_i(\overline{X}))$$

where $VI_i(\overline{X})$ is the vector of variable importance measures for the classification tree trained on output $\overline{Y}_i$, and M is the number of score outputs. The scaled states may be referred to as $\overline{X}=\overline{X}\circ VI_i(\overline{X})$. As such, this variant may be referred to as the Scaled Neighborhood Density and Variance (S-NDV) evaluator.

Having provided additional detail with respect to the adaptive search approach according to some example embodiments, the following describes the identification of boundaries based on the test scenario set formed by the adaptive search. The data set of simulation results generated during the search phase can, for example, easily approach hundreds of thousands to millions of runs. By clustering scenarios with similar behaviors and identifying the boundary sets between these clusters, a means for enabling methodical evaluation of the trending behaviors of the system is provided. According to some example embodiments, the clustering algorithms may be utilized due to a lack of a priori knowledge of the number of performance modes and the shape of the performance mode clusters being unknown. In addition, according to some example embodiments, techniques may be utilized that require minimal hyperparameter tuning if given normalized data sets with similar numbers of samples.

With respect to identifying performance modes, the nature of black box testing may not permit looking inside the AUT decision engine to determine which behavior is being executed. Instead, externally observable metrics may be used to infer changes in behavior from changes in the performance of the system. Unsupervised clustering techniques may therefore be applied to identify the performance modes of the system. In cases where the autonomy is scored using discrete values, e.g., where binary criteria are used for mission success and safety success, it may be trivial to identify distinct performance modes from the resulting scores. In these instances, the performance mode may simply be the combination of all the discrete score labels. In order to apply the example techniques provided herein to systems which provide continuous outputs, mean shift clustering may be utilized on the score space to identify the performance modes and classify the samples. Once the samples have been classified with respect to their respective performance modes, the sample may then be subjected to, for example, a density-based spatial clustering of applications with noise (DBSCAN), which is a density-based clustering technique which groups contiguous sets of samples together. Such an approach does not require a priori knowledge of the number of possible classifications or the landscape of the score space. If the hyperparameters are scaled appropriately according to the state space and score space, the hyperparameters may provide an efficient means of identifying performance modes from continuous outputs. Once samples have been classified by performance mode, the boundaries may be composed by performing a pair-wise comparison between every performance mode with a differing performance mode. A k-nearest neighbor detection algorithm may be utilized to determine the closest neighbor in a differing performance mode for each sample. Any samples that are within $D_\epsilon$ distance of their nearest neighbor in the differing performance mode can be added to the final boundary set, i.e., $D_{ij}<D_\epsilon$. The final boundary set may then be constructed from boundary pairs defined as $$B_{a,b}=[b_{(a,b),1}, \ldots, b_{(a,b),k}]$$

where a and b signify performance modes $\mathcal{P}_a$ and $\mathcal{P}_b$, respectively. The boundary pairs $b_{(a, b), i}$ may be composed of points in the sampled set $\mathcal{L}^N$ and satisfy:

$$b_{(a,b),i}: Y_{i1} \in P_a, Y_{i2} \in P_b, |X_{i1}-X_{i2}| \leq D_\epsilon$$

which is defined further, for example, in Algorithm 2.

---

Algorithm 2: Boundary Identification($\mathcal{L}$).

---

Input: A set N of labeled samples $\mathcal{L}$ containing the input
    states $X^N$ and output scores $Y^N$
Output: A set of identified performance modes, a collection
    of boundaries B, and distance estimate vector D
Let $\lambda_P$ be the threshold distance for the flat kernel
mean shift function, $\in_C$ and $n_{min}$ be the radius and minimum member parameters for the DBSCAN function. Let
$D_e$ be the maximum distance between two samples to
be considered part of a boundary.
$\mathcal{P}$ = MeanShift($Y^N$, $\lambda_P$). identify the performance modes
for all $\mathcal{P}_i \in \mathcal{P}$ do
    Create the set of all states belonging to that performance mode
    $X\mathcal{P}_i$ =$X_i|Y_i \in P_1$
    Append the new cluster of states $C_Y$ = [$\chi\mathcal{P}_i$, Y] to the
    list of existing clusters
    C − [$C_Y$]
end for
for all $C_Y \in$ C do
    Create a set of subclusters for the regions of interest
    using the DBSCAN algorithm
    $\hat{C}_Y$ = DBSCAN ($\overline{X}\mathcal{P}_i$, $\in_C$, $n_{min}$)
    Append the subclusters to the complete set of clusters
    $\hat{C} - [\hat{C}_Y]$
end for
for all $\hat{C}_{Yi}$ and $\hat{C}_{Yj} \in \hat{C}|Y_i \neq Y_j$ do
    $D_{ij}$ = knnsearch($\overline{X}_{P_i}$, $\overline{X}_{P_j}$)
    $B_{ij}$ = [$\chi\mathcal{P}_i$, $X_{P_i}$, $Y_i$, $Y_j$]∀$X_{P_j}$, $X_{P_j}$|$D_{ij}$ < $D_e$
end for
return B

---

With respect to boundary scaling, high-dimensional systems, according to some example embodiments, may dictate the use of variable importance scaling during the k-nearest neighbors search and DBSCAN steps of the boundary identification process. Such scaling may involve computing $\hat{X}^N$ as considered above, utilizing $\hat{X}_Y$ in place of $\overline{X}_Y$ during the DBSCAN clustering, and finally using $\overline{X}_{Yi}$ and $\overline{X}_{Yj}$ during the k-nearest neighbors search.

Additionally, boundary threshold criteria may be defined. In this regard, a reasonably complex scenario could contain several dozen input parameters. As such, there is a chance that only sparse coverage of the state space may be achieved even after applying the adaptive search approach described earlier. Special consideration of the distance threshold, $D_\epsilon$, may then be considered to account for changes in number of dimensions, number of samples, and the number of expected performance modes. As such, an option to allow for a scaled threshold criteria may be added based upon the distribution of estimated boundary distances for the entire data set. Therefore, for systems where the true boundary is unknown, the metric $D_{ij} < D_\epsilon$ may be replaced with a quantile threshold, where the boundary pairs $b_{(a, b), i}$ may be composed of points in the sampled set $\mathcal{L}^N$ and satisfy:

$$b_{(a,b),i} : Y_{i1} \in P_a, Y_{i2} \in P_b, Pr[D^K < D_i] \leq q_B$$

where $q_B$ is the quantile threshold. $D^K$ may be the estimated boundary distance for every boundary pair in $B_{a,\ b}$, and $D_i = |X_{i1} - X_{i2}|$ may be the distance between the states of pair $b_{(a,\ b),\ i}$. According to some example embodiments, the 20th percentile may be used as a quantile threshold.

As such, according to various example embodiments, a methodology for generating challenging, diverse test cases for an autonomous vehicle based upon discovery and identification of performance boundaries is provided. An adaptive search method may be implemented that addresses, for example, the challenge of preferentially sampling in boundary regions. Additionally, according to some example embodiments, a method for extracting the performance boundaries using unsupervised clustering and pairwise comparisons of samples from different performance modes is provided. These techniques have been applied to both ground-truthed test functions and a realistic autonomous system for a mission representing certification testing. The resulting boundary samples were shown to find pairs of scenarios where minor differences lead to large changes in system performance. These revelations could allow a test engineer or autonomy designer to better understand exactly which situations will trigger certain behaviors of the autonomy. The technique of searching for performance boundaries has applications to any autonomous system and mission. Searching for performance boundaries, as provided herein, can be easily adapted to any ground, air, sea-surface, or space platform and any state space that can be parameterized.

Figure 10:
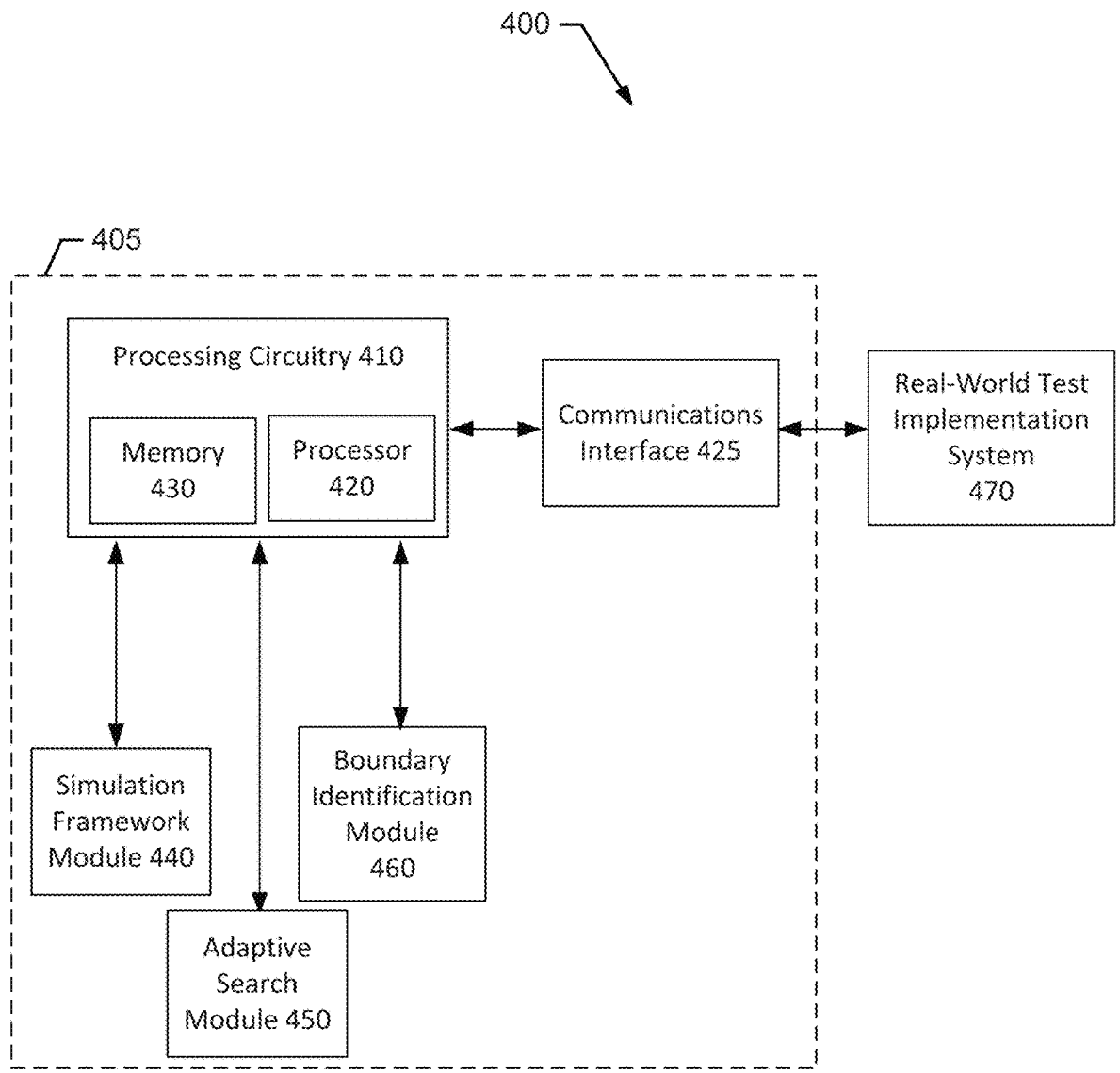
FIG. 10 illustrates a system and apparatus for determining decision-making engine performance according to some example embodiments.

FIG. 10 provides a block diagram of the electrical components of an example apparatus 405 within the context of a system 400 according to some example embodiments. The apparatus 405 and the system 400 may be configured to determine performance of a decision-making engine. In this regard, the apparatus 405 may be a computing device with communications capabilities via the communications interface 425. The communications capabilities of the apparatus 405 may provide for interfacing with a real-world test implementation system 470, as further described below.

Accordingly, FIG. 10 shows a block diagram of some components of an apparatus 405 configured to determine performance of decision-making engines, such as autonomy software. In this regard, the apparatus 405 comprises processing circuitry 410 that may be in operative communication with or embody, a communications interface 425, simulation framework module 440, adaptive search module 450, and boundary identification module 460. The processing circuitry 410 may interact with or embody a memory 430 and a processor 420. The processing circuitry 410 may be configurable to perform operations described herein. In this regard, the processing circuitry 410 may be configured to perform computational processing and memory management according to an example embodiment. In some embodiments, the processing circuitry 410 may be embodied as a chip or chip set. In other words, the processing circuitry 410 may comprise one or more physical packages (e.g., chips) including materials, components or wires on a structural assembly (e.g., a baseboard). According to some example embodiments, the processing circuitry 410 may be a computing cluster that includes a number of processors configured to operate in parallel to more rapidly complete tasks. The processing circuitry 410 may be configured to receive inputs (e.g., via peripheral components including the memory 430), perform actions based on the inputs, and generate outputs (e.g., for provision to peripheral components). In an example embodiment, the processing circuitry 410 may include one or more instances of a processor 420, associated circuitry, and memory 430. As such, the processing circuitry 410 may be embodied as a circuit chip (e.g., an integrated circuit chip, such as a field programmable gate array (FPGA)) configured (e.g., with hardware, software, or a combination of hardware and software) to perform operations described herein.

In an example embodiment, the memory 430 may include one or more non-transitory memory devices such as, for example, volatile or non-volatile memory that may be either fixed or removable. The memory 430 may be configured to store information, data, applications, instructions or the like for enabling, for example, test scenario simulations and the like to carry out various functions in accordance with example embodiments. For example, the memory 430 could be configured to buffer input data for processing by the processing circuitry 410. Additionally or alternatively, the memory 430 could be configured to store instructions for execution by the processing circuitry 410. Among the contents of the memory 430, applications may be stored for execution by the processing circuitry 410 in order to carry out the functionality associated with each respective application.

As mentioned above, the processing circuitry 410 may be embodied in a number of different ways. For example, the processing circuitry 410 may be embodied as various processing means such as one or more processors 420 that may be in the form of a microprocessor or other processing element, a coprocessor, a controller or various other computing or processing devices including integrated circuits such as, for example, an ASIC (application specific integrated circuit), an FPGA, or the like. In an example embodiment, the processing circuitry 410 may be configured to execute instructions stored in the memory 430 or otherwise accessible to the processing circuitry 410. As such, whether configured by hardware or by a combination of hardware and software, the processing circuitry 410 may represent an entity (e.g., physically embodied in circuitry—in the form of processing circuitry 410) capable of performing operations according to example embodiments while configured accordingly. Thus, for example, when the processing circuitry 410 is embodied as an ASIC, FPGA, or the like, the processing circuitry 410 may be specifically configured hardware for conducting the operations described herein. Alternatively, as another example, when the processing circuitry 410 is embodied as an executor of software instructions, the instructions may specifically configure the processing circuitry 410 to perform the operations described herein.

The communication interface 425 may include one or more interface mechanisms for enabling communication with other devices external to apparatus 400, via, for example, a network, such as a local area network. In some cases, the communication interface 425 may be any means such as a device or circuitry embodied in either hardware, or a combination of hardware and software that is configured to receive or transmit data from/to devices in communication with the processing circuitry 410. The communications interface 425 may be a wired or wireless interface and may support various communications protocols. Communications interface 425 may be operably coupled to an antenna to support wireless communications to other components. In this regard, the communications interface 425 and the antenna may support communications via, for example, Bluetooth or WIFI connections.

In an example embodiment, the processing circuitry 410 may be embodied as, include, or otherwise control, the apparatus 405 to perform various functionalities as described herein. As such, in some embodiments, the processing circuitry 410 may be said to cause each of the operations described in connection with, for example, the method described by the flowchart 200 of FIG. 7 and/or the method described by the flowchart 500 of FIG. 11, and the functionalities otherwise described herein. The processing circuitry 410 may therefore undertake the corresponding functionalities responsive to execution of instructions or algorithms configuring the processing circuitry 410 accordingly. The processing circuitry 410 may provide programmable control signals, selections, and the like to control the operation of the apparatus 405 responsive to execution of instructions stored in the memory 430.

According to some example embodiments, the processing circuitry 410 may include, embody, and/or implement a simulation framework module 440, adaptive search module 450, and boundary identification module 460. Via these modules, the apparatus 405 may be configured to perform simulations of decision-making engines to determine performance of the decision-making engines.

In this regard, the simulation framework module 440 may be configured to receive mission parameters indicative of a test mission. Further, according to some example embodiments, the simulation framework module 440 may be configured to receive environmental parameters and vehicle parameters. In this regard, according to some example embodiments, the mission parameters may include one or more waypoints and a destination. Further, according to some example embodiments, at least one of the environmental parameters is defined with respect to a range of possible values. Additionally, according to some example embodiments, the simulation framework module 440 may also be configured to receive performance score metrics as an input. In this regard, the performance score metrics may be defined by externally observable attributes of an outcome or performance mode of a given test scenario.

The adaptive search module 450 may be configured to perform an adaptive search using a surrogate model of the autonomy software under test to selectively generate test scenarios for simulation. To do so, the adaptive search module 450 may be configured to generate the surrogate model based on performance score metric values that are outputs from previously simulated test scenarios. Further, the adaptive search module 450 may be configured to iteratively generate a plurality of test scenarios based the surrogate model of the autonomy software under test. In this regard, each test scenario may be a defined set of mission parameters, environmental parameters, and vehicle parameters. According to some example embodiments, the test scenarios may be generated by analyzing the surrogate model to search for test scenarios that are likely to be near (i.e., within a threshold distance of) a performance boundary within the context of the surrogate model. Further, the adaptive search module 450 may also be configured to iteratively generate the plurality of test scenarios in accordance with an allocated number of test scenarios for the simulation testing. According to some example embodiments, the adaptive search module 450 may also be configured to update the surrogate model based on the performance score metric values for the plurality of test scenarios. Further, according to some example embodiments, the surrogate model may comprise a Gaussian Process Regression (GPR) meta-model. Additionally, being configured to generate the surrogate model may comprise generating the surrogate model based on randomly determined training scenarios that are initially provided.

According to some example embodiments, the simulation framework module 440 may also be configured to simulate test scenarios on the autonomy under test. In this regard, the simulation framework module 440 may be configured to simulate the plurality of test scenarios on the autonomy software under test to generate performance score metric values for each test scenario.

The boundary identification module 460 may be configured to cluster the plurality of test scenarios based on the performance score metric values to determine the performance boundaries for the autonomy software. In this regard, the performance boundaries may be defined as areas where less than a threshold change in one of the mission parameters, the environmental parameters, and vehicle parameters results in a test scenario having performance score metric values in a different performance mode. Further, the performance boundaries may define regions that are performance modes, where each performance mode is associated with an outcome category for the test scenarios. The boundary identification module 460 may also be configured to rank the plurality of test scenarios based on a respective distance to a performance boundary to identify test scenarios of interest for modification of the autonomy software or real-world field testing of an autonomous vehicle. According to some example embodiments, the boundary identification module 460 may be configured to cluster the plurality of test scenarios using mean shift clustering to classify each test scenario into a performance mode. Further, according to some example embodiments, the boundary identification module 460 may be configured to cluster the plurality of test scenarios based on the classification of each test scenario using density-based clustering.

Additionally, as mentioned above, the apparatus 405 may be in operable communication with a real-world test implementation system 470. An example of the real-world test implementation system 470 may be an autonomous vehicle that is operating under the control of the autonomy software. Further, via the communications interface 425, the real-world test implementation system 470 may be configured to receive a subset of the plurality of test scenarios from the apparatus 405. The real-world test implementation system 470 may be further configured to apply the subset of the plurality of test scenarios to an instance of the autonomy software operating on the real-world test implementation system to validate the autonomy software via in-field, real-world testing.

Figure 11:
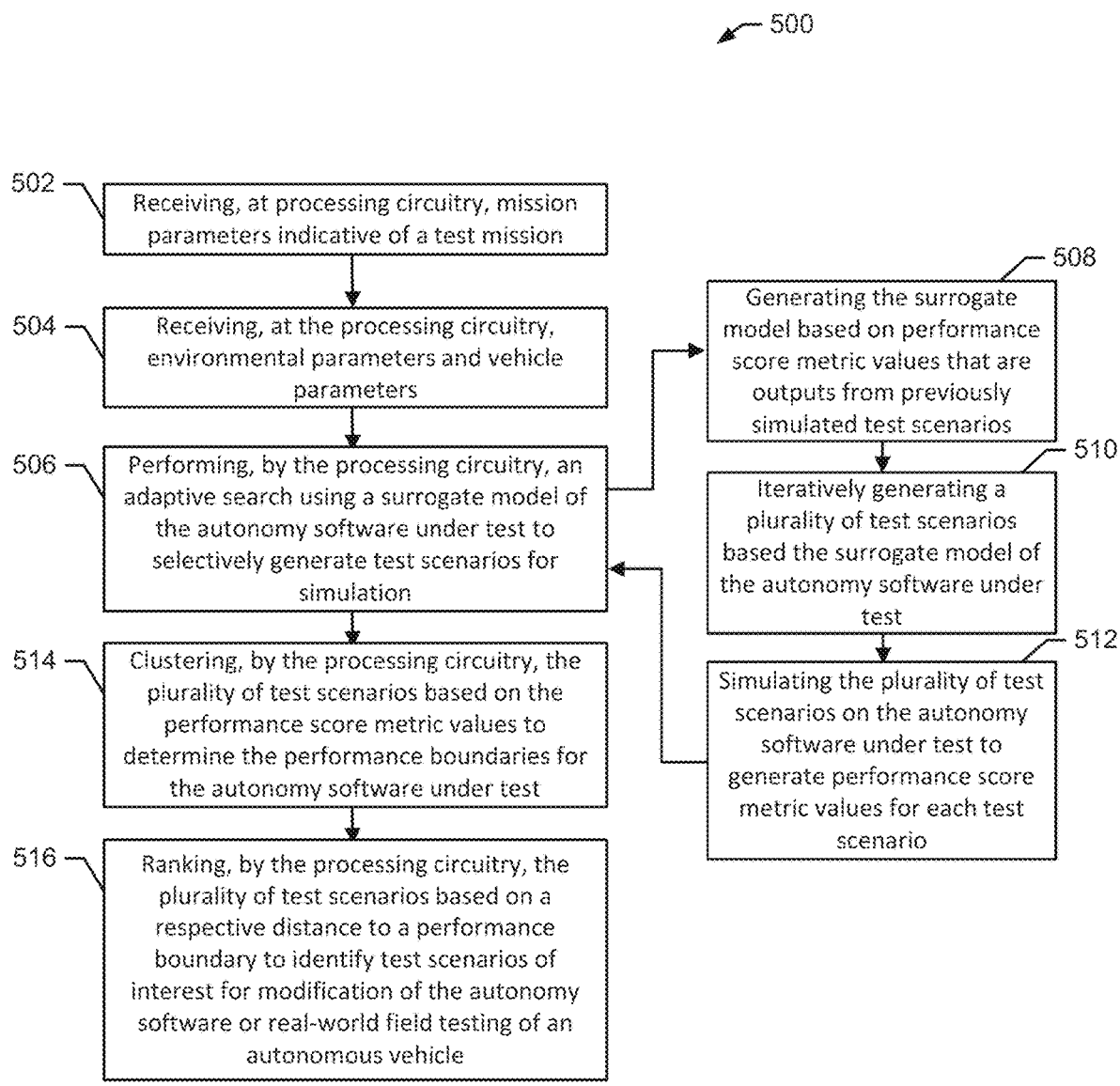
FIG. 11 illustrates a flowchart of an example method for determining decision-making engine performance according to an example embodiment.

According to some example embodiments, an example method may be provided for determining performance of decision-making engines as shown in flowchart 500 of FIG. 11. The example method may be implemented by various hardware including the processing circuitry 410 of the apparatus 405 in FIG. 10.

The example method may include, at 502, receiving, at processing circuitry 410, mission parameters indicative of a test mission, and, at 504, receiving, at the processing circuitry, environmental parameters and vehicle parameters. At 506, the example method may include performing, by the processing circuitry, an adaptive search using a surrogate model of the autonomy software under test to selectively generate test scenarios for simulation. In this regard, performing the adaptive search may comprise, at 508, generating the surrogate model based on performance score metric values that are outputs from previously simulated test scenarios. At 510, performing the adaptive search may comprise iteratively generating a plurality of test scenarios based on the surrogate model of the autonomy software under test. In this regard, each test scenario may have a defined set of mission parameters, environmental parameters, and vehicle parameters. Further, performing the adaptive search may also comprise, at 512, simulating the plurality of test scenarios on the autonomy software under test to generate performance score metric values for each test scenario.

The example method may also include, at 514, clustering, by the processing circuitry, the plurality of test scenarios based on the performance score metric values to determine the performance boundaries for the autonomy software under test. In this regard, the performance boundaries may be defined as areas where less than a threshold change in one (or more) of the mission parameters, the environmental parameters, and vehicle parameters results in a test scenario having performance score metric values in a different performance mode. Further, the performance boundaries may define regions that are performance modes, and each performance mode may be associated with an outcome category for the test scenarios. Also, at 516, the example method may include ranking, by the processing circuitry, the plurality of test scenarios based on a respective distance to a performance boundary to identify test scenarios of interest for modification of the autonomy software or real-world field testing of an autonomous vehicle.

As used herein, the term "module" is intended to include a computer-related entity, such as but not limited to hardware, software, or a combination of hardware and software. For example, a module may be, but is not limited to being a software or hardware implementation of a process, an object, an executable, and/or a thread of execution, which may be implemented via a processor or computer. By way of example, both an application running on a computing device and/or the computing device can be a module. One or more modules can reside within a process and/or thread of execution and a module may be localized on one computer and/or distributed between two or more computers. In addition, these modules can execute from various computer readable media having various data structures stored thereon. The modules may communicate by way of local and/or remote processes such as in accordance with a signal having one or more data packets, such as data from one module interacting with another module in a local system, distributed system, and/or across a network such as the Internet with other systems by way of the signal. Each respective module may perform one or more functions that will be described in greater detail herein. However, it should be appreciated that although such example is described in terms of separate modules corresponding to various functions performed, some examples need not necessarily utilize modular architectures for employment of the respective different functions. Thus, for example, code may be shared between different modules, or the processing circuitry itself may be configured to perform all of the functions described as being associated with the modules described herein. Furthermore, in the context of this disclosure, the term "module" should not be understood as a nonce word to identify any generic means for performing functionalities of the respective modules. Instead, the term "module" should be understood to be a modular entity that is specifically configured in, or can be operably coupled to, processing circuitry to modify the behavior and/or capability of the processing circuitry based on the hardware and/or software that is added to or otherwise operably coupled to the processing circuitry to configure the processing circuitry accordingly.

The embodiments present herein are provided as examples and therefore the associated inventions are not to be limited to the specific embodiments disclosed. Modifications and other embodiments are intended to be included within the scope of the appended claims. Moreover, although the foregoing descriptions and the associated drawings describe example embodiments in the context of certain example combinations of elements and/or functions, different combinations of elements and/or functions may be used to form alternative embodiments. In this regard, for example, different combinations of elements and/or functions other than those explicitly described above are also contemplated. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments.

That which is claimed:

1. A method for simulation testing an autonomy software, the method comprising:
   receiving, at processing circuitry, mission parameters indicative of a test mission;
   receiving, at the processing circuitry, environmental parameters and vehicle parameters;
   performing, by the processing circuitry, an adaptive search using a surrogate model of the autonomy software under test to selectively generate test scenarios for simulation, wherein performing the adaptive search comprises:
   generating the surrogate model based on performance score metric values that are outputs from previously simulated test scenarios;
   iteratively generating a plurality of test scenarios based on the surrogate model of the autonomy software under test, wherein each test scenario has a defined set of mission parameters, environmental parameters, and vehicle parameters; and
   simulating the plurality of test scenarios on the autonomy software under test to generate performance score metric values for each test scenario;
   clustering, by the processing circuitry, the plurality of test scenarios based on the performance score metric values to determine performance boundaries for the autonomy software under test, wherein the performance boundaries comprise boundaries between performance modes where less than a threshold change in one of the mission parameters, the environmental parameters, and vehicle parameters results in a test scenario having performance score metric values corresponding to a different performance mode, wherein each performance mode is associated with an outcome category for the test scenarios; and
   ranking, by the processing circuitry, the plurality of test scenarios based on a respective distance to a performance boundary to identify test scenarios of interest for modification of the autonomy software or real-world field testing of an autonomous vehicle.

2. The method of claim 1, wherein iteratively generating the plurality of test scenarios comprises iteratively generating the plurality of test scenarios in accordance with an allocated number of test scenarios for the simulation testing.

3. The method of claim 1, further comprising updating the surrogate model based on the performance score metric values for the plurality of test scenarios.

4. The method of claim 1, wherein the surrogate model comprises a Gaussian Process Regression (GPR) meta-model.

5. The method of claim 1, wherein generating the surrogate model comprises generating the surrogate model based on randomly determined training scenarios.

6. The method of claim 1, wherein the mission parameters include one or more waypoints and a destination.

7. The method of claim 1, wherein at least one of the environmental parameters is defined with respect to a range of possible values.

8. The method of claim 1, wherein clustering the plurality of test scenarios comprises clustering the plurality of test scenarios using mean shift clustering to classify each test scenario into a performance mode.

9. The method of claim 8, wherein clustering the plurality of test scenarios comprises further clustering the plurality of test scenarios based on classification of each test scenario using density-based clustering.

10. The method of claim 1, further comprising receiving the performance score metric values as an input, the performance score metric values being defined by externally observable attributes of an outcome of a given test scenario.

11. An apparatus configured to perform simulation testing of an autonomy software, the apparatus comprising processing circuitry configured to:
receive mission parameters indicative of a test mission;
receive environmental parameters and vehicle parameters;
perform an adaptive search using a surrogate model of the autonomy software under test to selectively generate test scenarios for simulation, wherein the processing circuitry configured to perform the adaptive search includes being configured to:
generate the surrogate model based on performance score metric values that are outputs from previously simulated test scenarios;
iteratively generate a plurality of test scenarios based on the surrogate model of the autonomy software under test, wherein each test scenario has a defined set of mission parameters, environmental parameters, and vehicle parameters; and
simulate the plurality of test scenarios on the autonomy software under test to generate performance score metric values for each test scenario;
cluster the plurality of test scenarios based on the performance score metric values to determine performance boundaries for the autonomy software under test, wherein the performance boundaries comprise boundaries between performance modes where less than a threshold change in one of the mission parameters, the environmental parameters, and vehicle parameters results in a test scenario having performance score metric values corresponding to a different performance mode, wherein each performance mode is associated with an outcome category for the test scenarios; and
rank the plurality of test scenarios based on a respective distance to a performance boundary to identify test scenarios of interest for modification of the autonomy software or real-world field testing.

12. The apparatus of claim 11, wherein the processing circuitry configured to iteratively generate the plurality of test scenarios includes being configured to iteratively generate the plurality of test scenarios in accordance with an allocated number of test scenarios for the simulation testing.

13. The apparatus of claim 11, wherein the processing circuitry is further configured to update the surrogate model based on the performance score metric values for the plurality of test scenarios.

14. The apparatus of claim 11, wherein the surrogate model comprises a Gaussian Process Regression (GPR) meta-model.

15. The apparatus of claim 11, wherein the processing circuitry configured to generate the surrogate model includes being configured to generate the surrogate model based on randomly determined training scenarios.

16. The apparatus of claim 11, wherein the mission parameters include one or more waypoints and a destination.

17. The apparatus of claim 11, wherein at least one of the environmental parameters is defined with respect to a range of possible values.

18. The apparatus of claim 11, wherein processing circuitry configured to cluster the plurality of test scenarios includes being configured to cluster the plurality of test scenarios using mean shift clustering to classify each test scenario into a performance mode.

19. A system comprising:
an apparatus comprising processing circuitry, the apparatus being configured to perform simulation testing of an autonomy software; and
a real-world test implementation system;
wherein the processing circuitry of the apparatus is configured to:
receive mission parameters indicative of a test mission;
receive environmental parameters and vehicle parameters;
perform an adaptive search using a surrogate model of the autonomy software under test to selectively generate test scenarios for simulation, wherein the processing circuitry configured to perform the adaptive search includes being configured to:
generate the surrogate model based on performance score metric values that are outputs from previously simulated test scenarios;
iteratively generate a plurality of test scenarios based on the surrogate model of the autonomy software under test, wherein each test scenario has a defined set of mission parameters, environmental parameters, and vehicle parameters; and
simulate the plurality of test scenarios on the autonomy software under test to generate performance score metric values for each test scenario;
cluster the plurality of test scenarios based on the performance score metric values to determine performance boundaries for the autonomy software under test, wherein the performance boundaries comprise boundaries between performance modes where less than a threshold change in one of the mission parameters, the environmental parameters, and vehicle parameters results in a test scenario having performance score metric values corresponding to a different performance mode, wherein each performance mode is associated with an outcome category for the test scenarios; and rank the plurality of test scenarios based on a respective distance to a performance boundary to identify test scenarios of interest for real-world field testing;

wherein the real-world test implementation system is configured to receive a subset of the plurality of test scenarios from the apparatus and apply the subset of the plurality of test scenarios to an instance of the autonomy software operating on the real-world test implementation system to validate the autonomy software.

20. The system of claim 19, wherein the processing circuitry of the apparatus is configured to cluster the plurality of test scenarios comprises being configured to further cluster the plurality of test scenarios based on classification of each test scenario using density-based clustering.

* * * * *